(12) United States Patent
Matsuura et al.

(10) Patent No.: US 7,659,575 B2
(45) Date of Patent: Feb. 9, 2010

(54) SEMICONDUCTOR DEVICE

(75) Inventors: Hitoshi Matsuura, Tokyo (JP); Yoshito Nakazawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 40 days.

(21) Appl. No.: 12/138,828

(22) Filed: Jun. 13, 2008

(65) Prior Publication Data

US 2009/0026535 A1 Jan. 29, 2009

(30) Foreign Application Priority Data

Jul. 27, 2007 (JP) .............................. 2007-196091

(51) Int. Cl.
*H01L 29/94* (2006.01)

(52) U.S. Cl. ........................ 257/330; 257/331; 257/492; 257/E29.26

(58) Field of Classification Search ................. 257/330, 257/331, 335–346, 492, 493, E29.26, E29.261
See application file for complete search history.

(56) References Cited

U.S. PATENT DOCUMENTS 7,271,068 B2 * 9/2007 Kubo et al. ................. 438/270

FOREIGN PATENT DOCUMENTS

| JP | 2000-216385 | 8/2000 |
| JP | 2001-168329 | 6/2001 |
| JP | 2001-217419 | 8/2001 |

* cited by examiner

*Primary Examiner*—Zandra Smith
*Assistant Examiner*—Paul E Patton
(74) *Attorney, Agent, or Firm*—Mattingly & Malur, P.C.

(57) ABSTRACT

The technology of preventing lowering of the element breakdown voltage of a trench gate control type semiconductor element is offered. $n^-$ type epitaxial layer (drift region) formed in the main surface side of the substrate, p type semiconductor layer (channel region) formed in $n^-$ type epitaxial layer, and $p^-$ type well (electric field relaxation layer) which was formed in $n^-$ type epitaxial layer in contact with the p type semiconductor layer and whose depth is deeper than the p type semiconductor layer are included. The trench whose depth is deeper than $p^-$ type well is patterned in the substrate, and the second gate electrode is formed in the inside of the trench via the insulation film. Among the trenches in the cell area in which power MISFET is formed, one end of $p^-$ type well is formed between a plurality of cell trenches in which a second gate electrode is formed, and the other end of $p^-$ type well is formed in the peripheral region contiguous to the cell area.

10 Claims, 28 Drawing Sheets

SEMICONDUCTOR DEVICE

CROSS-REFERENCE TO RELATED APPLICATION

The present application claims priority from Japanese patent application No. 2007-196091 filed on Jul. 27, 2007, the content of which is hereby incorporated by reference into this application.

1. Field of the Invention

The present invention relates to a semiconductor device, and particularly relates to an effective technology in the application to a gate control type transistor.

2. Description of the Background Art

The semiconductor element of the large electric power use which can treat electric power of several watts or more is called power semiconductor element. Various transistors, such as FET (Field Effect Transistor) and IGBT (Insulated Gate Bipolar Transistor), are proposed. Among these, power MIS (Metal Insulator Semiconductor) FET has some which are called the so-called vertical type and the so-called horizontal type. Furthermore according to the structure of a gate part, they are classified into structures, such as a planar gate type and a trench gate type by which a gate electrode is formed in the trench (trench) which was trenched in the substrate. In power MISFET, in order to obtain big electric power, for example, the structure which connected many (for example, tens of thousands of pieces) MISFET cells of the fine pattern in parallel is adopted.

Present inventors performed the prior art search based on the invented result in the viewpoint of lowering prevention of the element breakdown voltage (breakdown voltage) of a gate control type semiconductor element, and the viewpoint of trench gate shape. As a result, in the viewpoint of trench gate shape, Japanese patent laid-open No. 2000-216385 (Patent Reference 1), Japanese patent laid-open No. 2001-217419 (Patent Reference 2), and Japanese patent laid-open No. 2001-168329 (Patent Reference 3) were extracted. Patent References 1 and 2 make it the theme to suppress lowering of a gate insulating breakdown voltage as a whole, therefore lose the end part of a trench gate, and do not have the description about lowering prevention of the element breakdown voltage of a trench gate control type semiconductor element. Patent Reference 3 makes the theme lowering prevention of the element breakdown voltage of a trench gate control type semiconductor element, and connects between the terminations of a trench with a connection part.

[Patent Reference 1] Japanese patent laid-open No. 2000-216385

[Patent Reference 2] Japanese patent laid-open No. 2001-217419

[Patent Reference 3] Japanese patent laid-open No. 2001-168329

SUMMARY OF THE INVENTION

Present inventors are examining the semiconductor device provided with the gate control type power semiconductor element. The semiconductor device (power MISFET) provided with the n channel type trench gate control type power MISFET cell which present inventors examined is shown in FIG. 1 and FIG. 2. FIG. 1 is a principal part plan view of the semiconductor device which present inventors examined, and FIG. 2 is a cross-sectional view in the A-A line of FIG. 1. Reference A1 of FIG. 1 shows the cell area in which a power MISFET cell is formed, and reference A2 shows the peripheral region contiguous to a cell area. That is, epitaxial substrate (merely henceforth a substrate) 1S shown by FIG. 1 has cell area A1 in the rightside of the drawing from the boundary of cell area A1 and peripheral region A2, and has peripheral region A2 in the leftside of the drawing. In FIG. 1, in order to make a drawing legible, some parts are not illustrated.

Below, with reference to FIG. 1 and FIG. 2, the structure of the semiconductor device which present inventors examined is explained. In the main surface of substrate 1S (element formation surface), $n^-$ type epitaxial layer 2 which forms the drift region (drain region) of power MISFET, p type semiconductor layer 14 which forms the channel region on $n^-$ type epitaxial layer 2, $n^+$ type semiconductor layer 15 which forms the source region on p type semiconductor layer 14, and $p^-$ type well 100 which forms an electric field relaxation layer in $n^-$ type epitaxial layer 2 in contact with p type semiconductor layer 14 are formed. An electric field relaxation layer is the region where the impurity was implanted into substrate 1S in order to improve a breakdown voltage.

Trench 6 is patterned in the main surface of substrate 1S. A plurality of cell trenches 6a are formed with the prescribed interval (narrow pitch) among trenches 6 which are in cell area A1 and cross an A-A line direction (prescribed direction). A plurality of leading trenches 6b prolonged in the direction of peripheral region A2 from cell area A1 are formed among trenches 6 in peripheral region A2. Connection trench 6c which connects the termination of a plurality of leading trenches 6b is formed among trenches 6 in peripheral region A2. As shown in FIG. 1, in the semiconductor device which present inventors examined, connection trench 6c has connected all the terminations of a plurality of leading trenches 6b.

In cell area A1, first gate electrode 8G1 is formed in the internal bottom side of cell trench 6a via insulation film 7. Second gate electrode 10G1 is formed in the inside upper part of cell trench 6a via insulation film 9. Second gate electrode 10G1 is formed as a gate electrode (intrinsic gate electrode) of power MISFET, and first gate electrode 8G1 is formed as a dummy gate electrode.

On the other hand, in peripheral region A2, first gate electrode lead-out part 8G2 electrically connected with first gate electrode 8G1 is formed on insulation film 4 which forms an element isolation region. Second gate electrode lead-out part 10G2 electrically connected with second gate electrode 10G1 is formed in the upper part of first gate electrode lead-out part 8G2 via insulation film 9. First gate electrode lead-out part 8G2 and second gate electrode lead-out part 10G2 are electrically connected by contact CNT1 formed in the opening of insulation film 9. Second gate electrode lead-out part 10G2 and gate electrode wiring 21GL are electrically connected by contact CNT2 formed in the opening of interlayer insulation film 16.

The shallow trench which penetrates $n^+$ type semiconductor layer 15 and reaches p type semiconductor layer 14 is formed in the main surface of substrate 1S of cell area A1, and $p^+$ type semiconductor layer 20 is formed in p type semiconductor layer 14 at the side of the bottom of the shallow trench. $n^+$ type semiconductor layer 15 and source electrode 21S are electrically connected by contact CNT3 formed in this shallow trench. Contact CNT3 electrically connects p type semiconductor layer 14 and source electrode 21S via $p^+$ type semiconductor layer 20, and it also forms the body contact to source potential (ground potential).

Laminated film 26 which forms drain electrode 26D of power MISFET is formed in the back surface of substrate 1S, and the laminated film 26 is formed in order of the titanium film, the nickel film, and the gold film from the semiconductor substrate 1 side.

In the semiconductor device which this present inventor examined, 0V is applied between second gate electrode 10G1 and source electrode 21S (second gate electrode 10G1 and n+ type semiconductor layer 15 of the source region are grounded). The result of having measured the wave form of the breakdown voltage between drain electrode 26D-source electrodes 21S, i.e., drain source breakdown voltage which is an element breakdown voltage of power MISFET, (BVDSS) is shown in FIG. 3. This drain source breakdown voltage is also a breakdown voltage of the backward diode built in power MISFET.

As shown in FIG. 3, the phenomenon in which the breakdown voltage wave form between drain and source will oscillate (unstabilize) was confirmed in the experiment. Present inventors have noticed power MISFET by which such an oscillation wave form is observed being in the tendency to become easy to deteriorate by thermal and electric stress. That is, present inventors solved becoming easy to cause breakdown voltage lowering by experiment. One of the causes which cause breakdown voltage lowering is explained to below.

As one of the features of the layout of the semiconductor device which was shown in FIG. 1 and FIG. 2 and which present inventors examined, there is the point of having connected linearly the terminal parts of leading trench 6b (trench 6) altogether, i.e., the point of having connected all the terminations of adjacent leading trench 6b by connection trench 6c. This is for reducing a possibility that the abnormalities in form of local trench 6 will occur by connecting the termination of leading trench 6b linearly.

However, it will become the structure where p− type well 100 is divided into p− type well 100A and p− type well 100B by connection trench 6c which connects all the terminations of leading trench 6b. In this case, where second gate electrode 10G1 and n+ type semiconductor layer 15 of the source region are grounded, voltage is applied to n− type epitaxial layer 2 of a drain region and avalanche breakdown is done (BVDSS state), since it is high impedance, p− type well 100B of the divided side may be in a floating state effectually. The place which will be in a floating state effectually in this way exists, a breakdown voltage wave form oscillates (unstabilizes), and it is thought that it becomes easy to deteriorate by thermal and electric stress.

Then, in order to prevent a floating state, it is possible to form the contact which fixes the electric potential of p− type well 100B to ground potential. However, in order to secure the region in which the contact is formed, the substrate area (chip area) must be made wide. When little contact is formed and a floating state is prevented, since electric potential is fixable in the portion near the contact, it is thought that there is a certain amount of effect, but in the region distant from contact, impedance is still very high.

A purpose of the present invention is to offer the technology of preventing lowering of the element breakdown voltage of a gate control type semiconductor element.

The above-described and the other purposes and novel features of the present invention will become apparent from the description herein and accompanying drawings.

Of the inventions disclosed in the present application, typical ones will next be summarized briefly.

The semiconductor device provided with n channel type power MISFET concerning the 1 embodiment of the present invention includes n− type epitaxial layer (drift region) formed in the main surface side of the substrate, p type semiconductor layer (channel region) formed in n− type epitaxial layer, and p− type well (electric field relaxation layer) which was formed in n− type epitaxial layer in contact with the p type semiconductor layer and whose depth is deeper than the p type semiconductor layer. The trench whose depth is deeper than p− type well is patterned in the substrate, and a gate electrode is formed in the inside of the trench via the gate insulation film. Among the trenches in the cell area in which power MISFET is formed, one end of p− type well is formed between a plurality of cell trenches in which a gate electrode is formed, and the other end of p− type well is formed in the peripheral region contiguous to the cell area.

Advantages achieved by some of the most typical aspects of the invention disclosed in the present application will be briefly described below.

According to this 1 embodiment, lowering of an element breakdown voltage can be prevented by forming p− type well which forms an electric field relaxation layer in a cell area from a peripheral region.

DETAILED DESCRIPTION OF THE PREFERRED EMBODIMENTS

Figure 1:
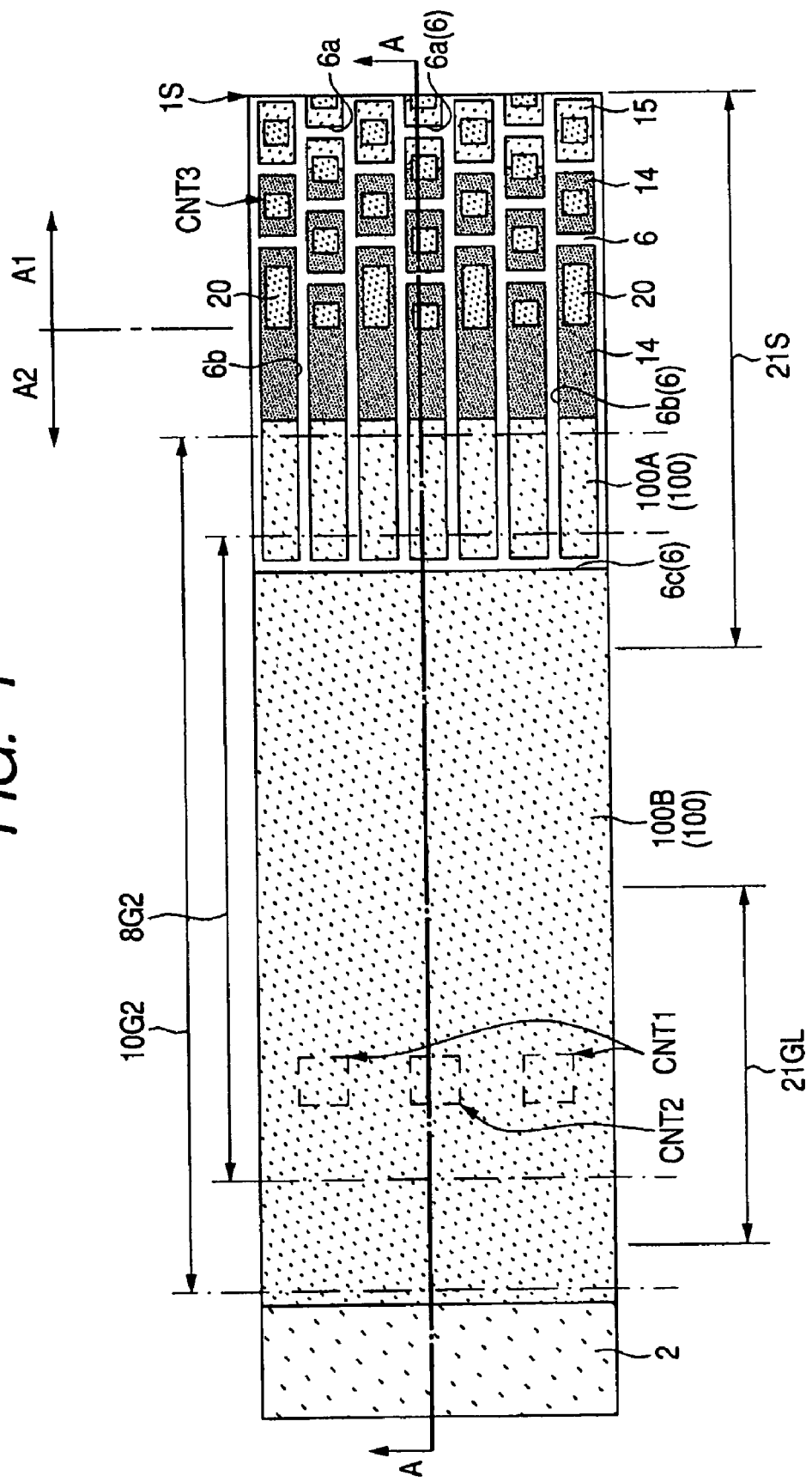
FIG. 1 is a principal part plan view of the semiconductor device which present inventors examined.

Hereafter, embodiments of the invention are explained in detail based on drawings. In all the drawings for describing the embodiments, members of a like function will be identified by like reference numerals and overlapping descriptions will be omitted. In the drawing explaining the following embodiments, in order to make structure intelligible, even if it is a plan view, hatching may be attached.

Embodiment 1

Embodiment 1 of the present invention explains the case where the present invention is applied to the semiconductor device (power MISFET) provided with a trench gate control type power MISFET cell of n channel type.

Figure 4:
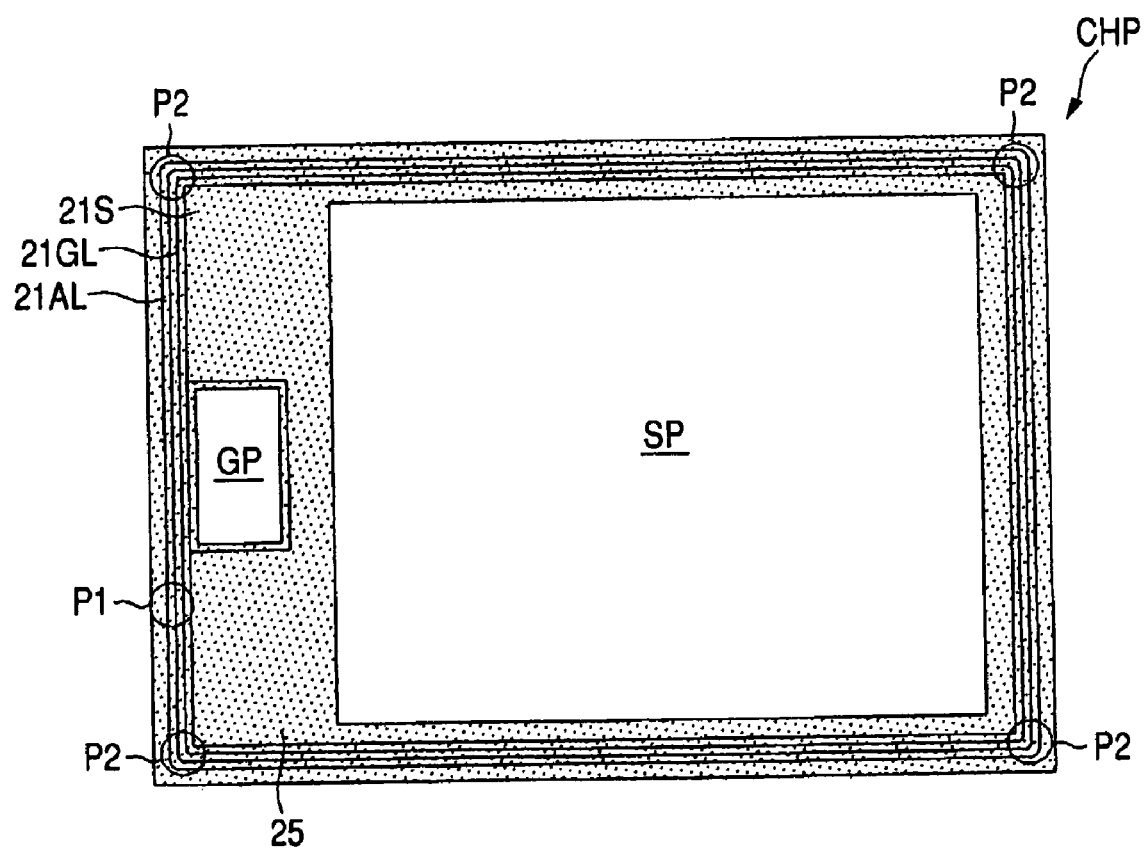
FIG. 4 is a plan view of a chip state of the semiconductor device in Embodiment 1 of the present invention.

FIG. 4 is a plan view showing semiconductor chip (henceforth a chip) CHP in Embodiment 1. As shown in FIG. 4, surface protection film 25 which consists of a polyimide resin film, for example is formed in the main surface (front surface) of semiconductor chip CHP. Source electrode 21S exposed from this surface protection film 25 forms source pad SP, and exposed gate electrode wiring 21GL forms gate pad GP. Gate electrode wiring 21GL is formed so that the periphery of source electrode 21S may be surrounded. Outermost periphery electrode wiring 21AL which forms the so-called channel stopper is formed so that the periphery of gate electrode wiring 21GL may furthermore be surrounded. The drain electrode is formed in the back surface of semiconductor chip CHP.

Figure 5:
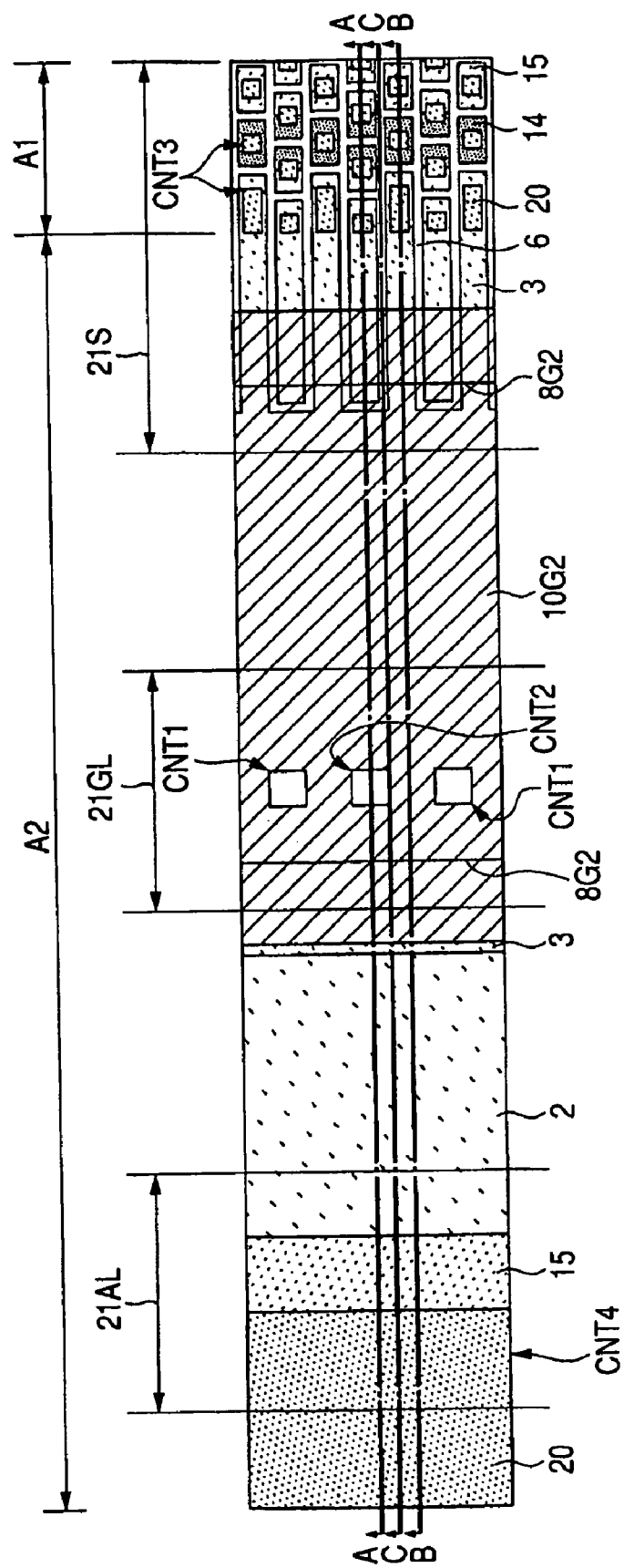
FIG. 5 is the plan view which expanded principal part P1 of FIG. 4.
Figure 6:
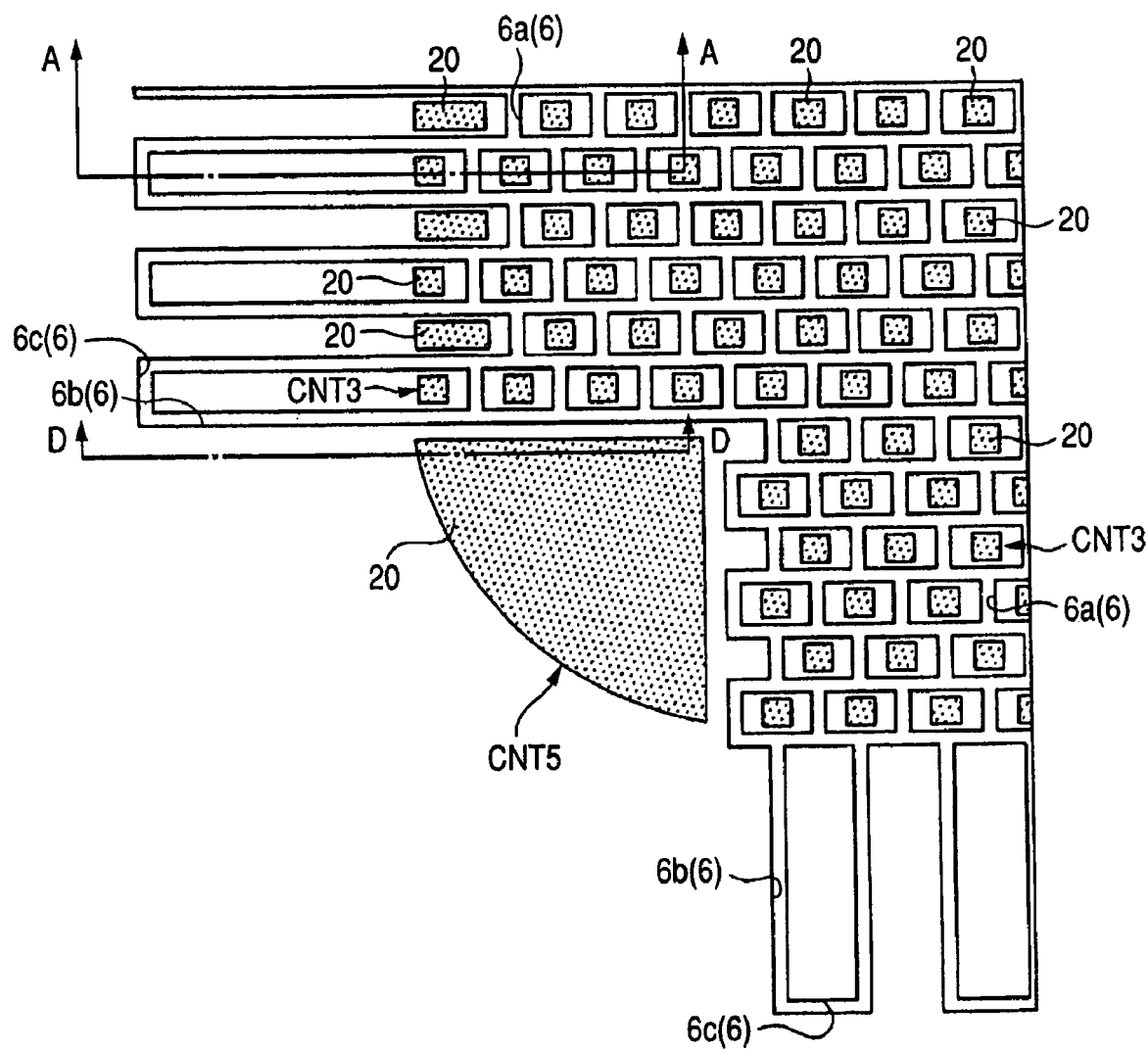
FIG. 6 is the plan view which expanded principal part P2 of FIG. 4.
Figure 7:
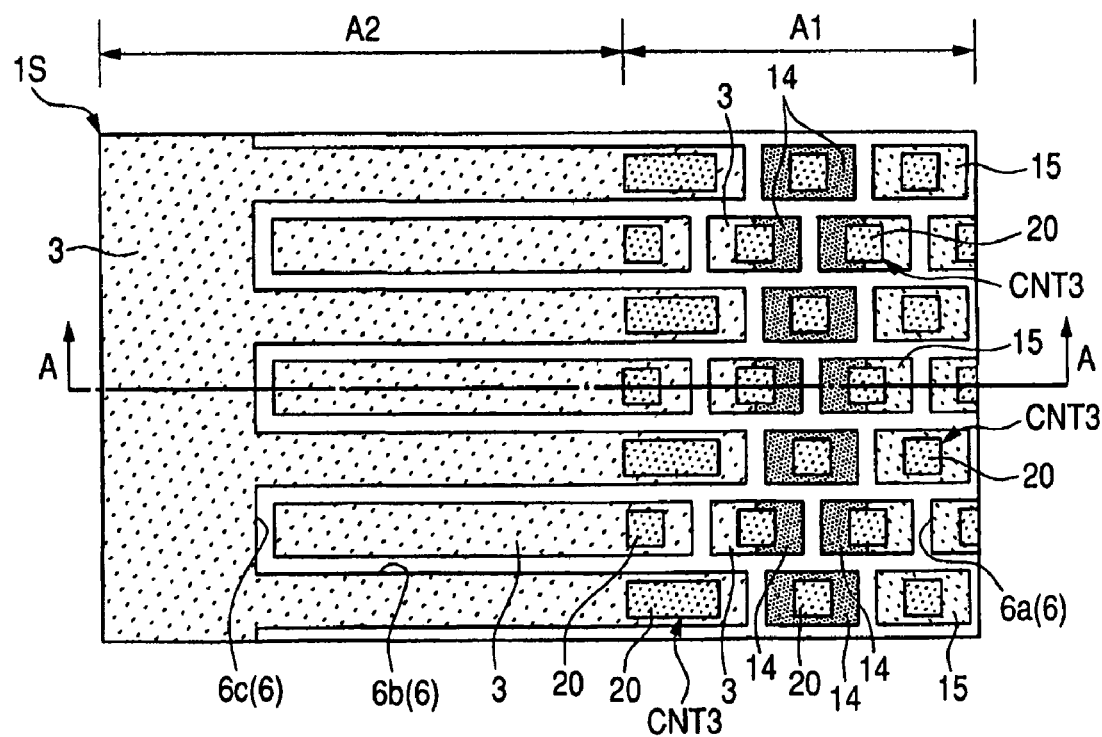
FIG. 7 is the plan view which expanded the circumference of a cell area shown in FIG. 5.
Figure 8:
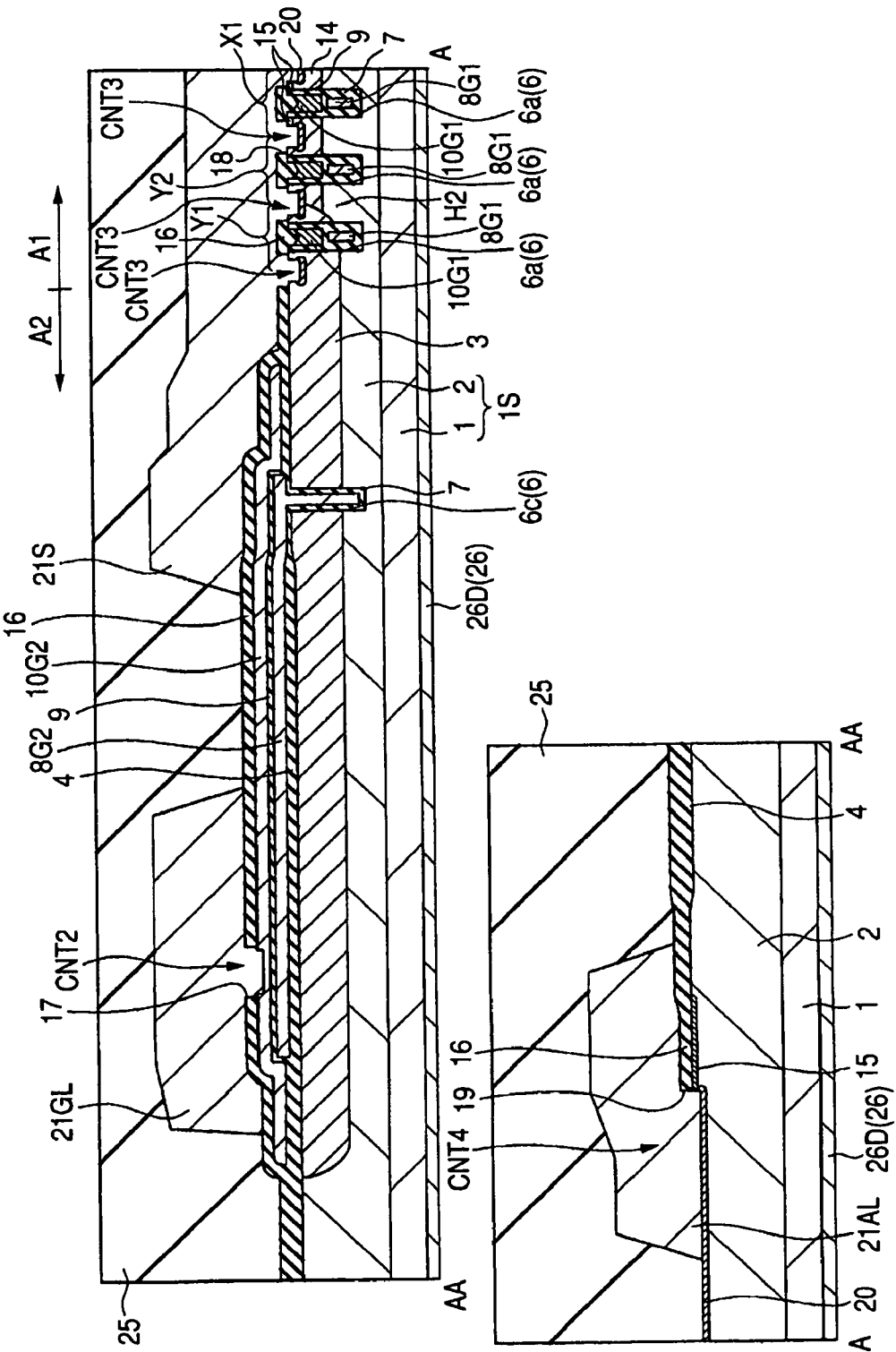
FIG. 8 is a cross-sectional view in the A-A line of FIG. 5.
Figure 9:
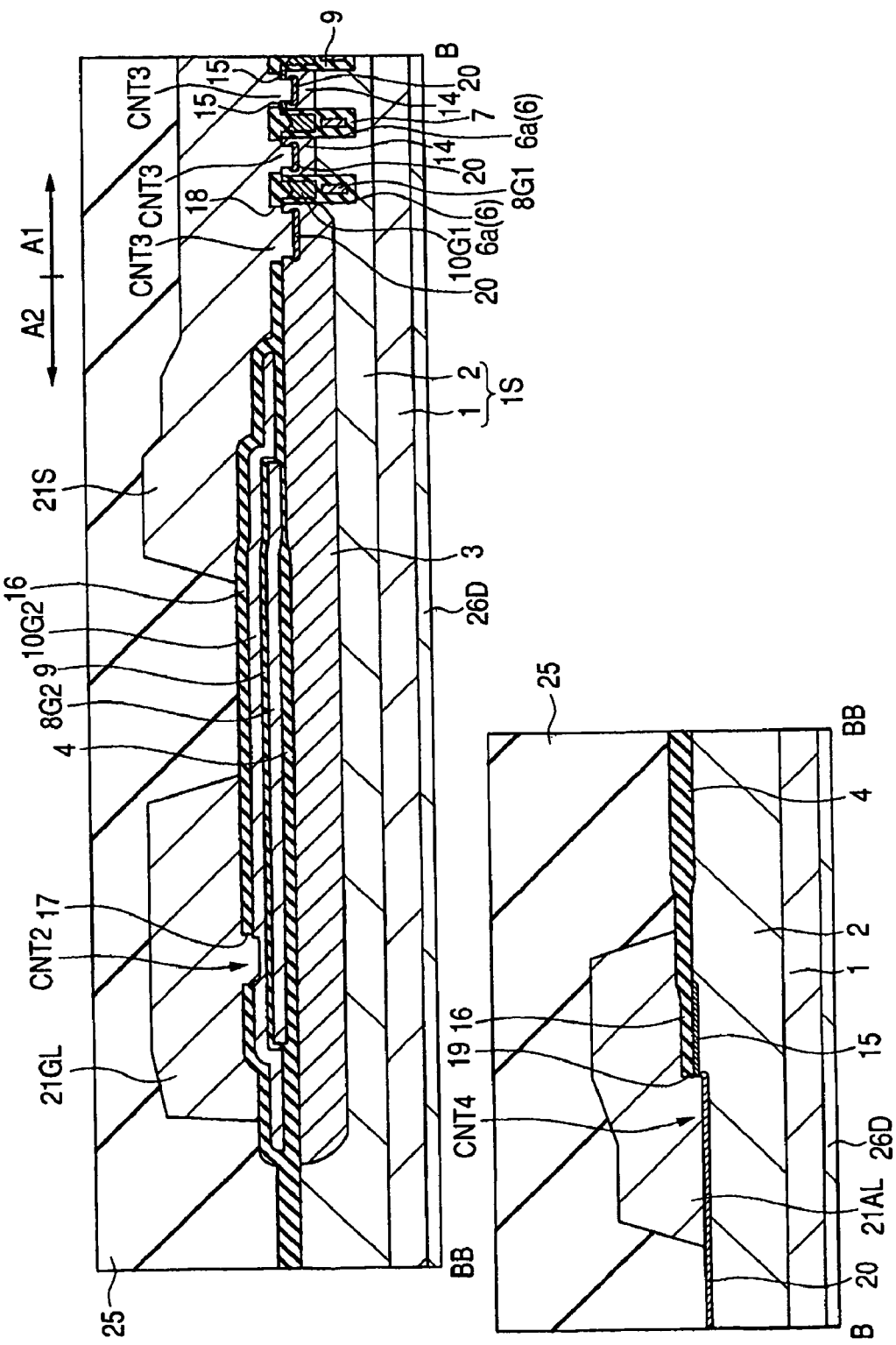
FIG. 9 is a cross-sectional view in the B-B line of FIG. 5.
Figure 10:
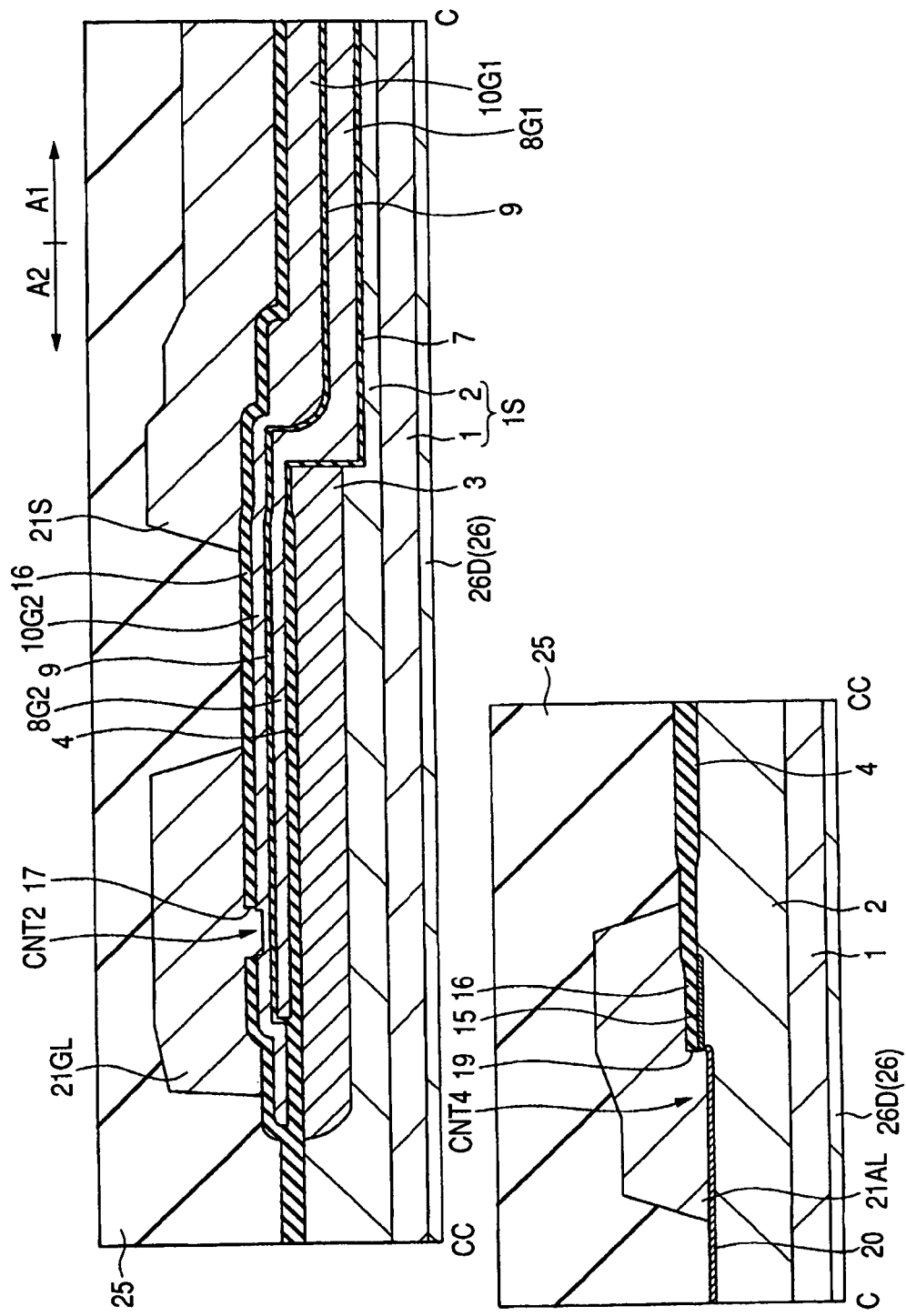
FIG. 10 is a cross-sectional view in the C-C line of FIG. 5.
Figure 11:
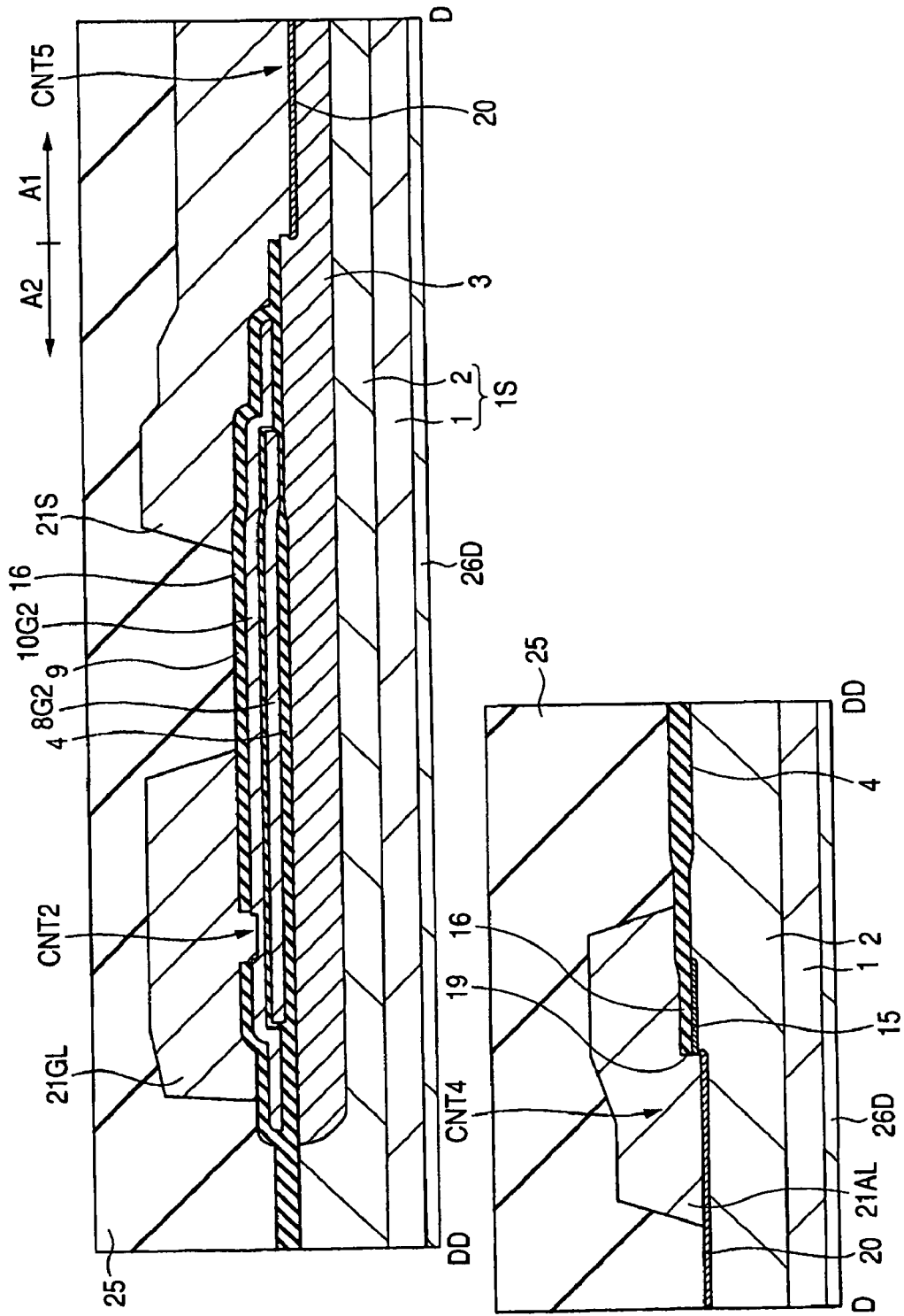
FIG. 11 is a cross-sectional view in the D-D line of FIG. 6.

FIG. 5 and FIG. 6 are the plan views which expanded principal part P1 and principal part P2 of FIG. 4, respectively. Reference A1 of FIG. 5 shows the cell area in which a power MISFET cell is formed, and reference A2 shows the peripheral region contiguous to the cell area. In FIG. 5, in order to make a drawing legible, some parts are not illustrated. FIG. 7 is the plan view which expanded the circumference of cell area A1 shown in FIG. 5. FIG. 8 is a cross-sectional view in the A-A line of FIG. 5, FIG. 9 is a cross-sectional view in the B-B line of FIG. 5, FIG. 10 is a cross-sectional view in the C-C line of FIG. 5, and FIG. 11 is a cross-sectional view in the D-D line of FIG. 6.

$n^-$ type epitaxial layer 2 which introduced the n type impurity is formed in the main surface (element formation surface) side of substrate 1S using $n^+$ type semiconductor substrate 1 as a base material. In the present application, semiconductor substrate 1 and $n^-$ type epitaxial layer 2 are collectively used as substrate (epitaxial substrate) 1S.

In $n^-$ type epitaxial layer 2, $p^-$ type well 3 which introduced the p type impurity is formed. Insulation film 4 for separating an element is formed in the predetermined region on $n^-$ type epitaxial layer 2. An n channel type power MISFET cell is formed in cell area A1 (active region) separated by insulation film 4. $p^-$ type well 3 is formed in order to form pn junction with a high breakdown voltage as an electric field relaxation layer, and it is connected to source potential. An electric field relaxation layer is the region where the impurity was implanted into substrate 1S in order to improve a breakdown voltage.

N channel type power MISFET has $n^+$ type semiconductor layer 15 which is the source region formed in $n^-$ type epitaxial layer 2, and a drain region which consists of $n^-$ type epitaxial layer 2 and substrate 1S. And p type semiconductor layer 14 which forms the semiconductor region for channel formation (channel region) is formed in $n^-$ type epitaxial layer 2 between $n^+$ type semiconductor layer 15 and a drain region. Phosphorus (P) or arsenic (As) is introduced into $n^+$ type semiconductor layer 15 of the source region, for example, and boron (B) is introduced into p type semiconductor layer 14 of the channel region, for example.

A plurality of trenches 6 extending and existing in the direction (thickness direction of substrate 1S) which intersects perpendicularly to the main surface of substrate 1S are formed in the main surface of substrate 1S. Trench 6 is formed so that p type semiconductor layer 14 for channel formation may be penetrated from the main surface of substrate 1S and a termination may be done in the lower part of $n^-$ type epitaxial layer 2. Trench 6 is patterned in the main surface of substrate 1S, and the depth from the main surface of substrate 1S is deeper than $p^-$ type well 3.

As shown in FIG. 7, trench 6 is patterned in the main surface of substrate 1S. A plurality of cell trenches 6a are formed with the prescribed interval (narrow pitch) among trenches 6 which are in cell area A1 and cross a prescribed direction (for example, A-A line direction). A plurality of leading trenches 6b prolonged in the direction of peripheral region A2 from cell area A1 are formed among trenches 6 in peripheral region A2. Connection trench 6c which connects the termination of a plurality of leading trenches 6b is formed among trenches 6 in peripheral region A2. In Embodiment 1, the pattern of trench 6 of cell area A1 is made a ladder mesh pattern, and it is set as the pattern that connection trench 6c of peripheral region A2 connects the termination of leading trench 6b in a pair (every two pieces).

Thus, the on resistance of power MISFET can be reduced by making the pattern of trench 6 in cell area A1 into a mesh pattern. Processing (patterning) of trench 6 can be made easy by using a ladder mesh as a mesh pattern. That is, it is possible to be easy to generate a problem in processing in the case of processing of trench 6 by trench 6 being a pattern which crosses at cross shape. So, in Embodiment 1, it is set as the ladder pattern that trench 6 crosses at the shape of a T shape.

First gate electrode 8G1 is formed in the internal bottom side of trench 6 in cell area A1 via insulation film 7. Second gate electrode 10G1 is formed in the inside upper part of trench 6 in cell area A1 via insulation film 9. Although both insulation film 7 and insulation film 9 consist of a silicon oxide film, the side of insulation film 7 is formed more thickly than insulation film 9. Concretely, the thickness of insulation film 7 is about 200 nm, for example, and the thickness of insulation film 9 is about 50 nm, for example.

In cell area A1, first gate electrode 8G1 is formed in the internal bottom side of cell trench 6a via insulation film 7. Second gate electrode 10G1 is formed in the inside upper part of cell trench 6a via insulation film 9. Second gate electrode 10G1 is formed as a gate electrode (intrinsic gate electrode) of power MISFET, and first gate electrode 8G1 is formed as a dummy gate electrode. Thus, in Embodiment 1, the double gated structure which comprised first gate electrode 8G1 and second gate electrode 10G1 is adopted.

Both first gate electrode 8G1 and second gate electrode 10G1 are mutually insulated by insulation film 9 which intervened between first gate electrode 8G1 and second gate electrode 10G1, although they consist of a low resistance polysilicon film.

However, in Embodiment 1, in trench 6, although insulation film 9 has electrically separated first gate electrode 8G1 and second gate electrode 10G1, first gate electrode 8G1 is electrically connected with second gate electrode 10G1 except trench 6. That is, in Embodiment 1, by making first gate electrode 8G1 and second gate electrode 10G1 into the same electric potential, the dielectric strength of insulation film 9 which intervenes between first gate electrode 8G1 and second gate electrode 10G1 does not influence the breakdown voltage of second gate electrode 10G1.

Therefore, improvement in a breakdown voltage of second gate electrode 10G1 can be aimed at. That is, the breakdown voltage of second gate electrode 10G1 tends to receive influence in the dielectric strength of insulation film 9 which intervenes between first gate electrode 8G1 and second gate electrode 10G1. However, at Embodiment 1, by making into the same electric potential first gate electrode 8G1 and second gate electrode 10G1 which sandwiched this insulation film 9, since voltage load is kept from being applied to intervening insulation film 9, the breakdown voltage of second gate electrode 10G1 can be improved.

Second gate electrode 10G1 is an intrinsic gate electrode (control electrode) of power MISFET, and the voltage for the motion control of power MISFET is applied. The upper surface of second gate electrode 10G1 is low a little rather than the main surface of substrate 1S, and interlayer insulation film 16 which consists of a silicon oxide film is embedded, for example on the upper surface of second gate electrode 10G1 which becomes depressed low. The channel of power MISFET is formed in p type semiconductor layer 14 for channel formation opposite to the side surface of second gate electrode 10G1. That is, the channel current of power MISFET flows toward the thickness direction of substrate 1S which intersects perpendicularly with substrate 1S along the side surface of trench 6. That is, the channel current of power MISFET flows toward $n^-$ type epitaxial layer 2 of a drain region from $n^+$ type semiconductor layer 15 of the source region.

In cell area A1, the active cell which functions as a power MISFET cell, and the inactive cell which does not function as power MISFET cells are formed. It can be said that the active cell which functions as a power MISFET cell is a cell into which channel current flows. In other words, the cell which has $n^+$ type semiconductor layer 15 used as the source region as a power MISFET cell can be called active cell, and the cell which does not have $n^+$ type semiconductor layer 15 can also be called inactive cell.

The cell is arranged two-dimensional almost regularly and the inactive cell is put in order at least by 1 row of the outermost periphery of arrangement. In FIG. 8, it is a row of two rows of inactive cell Y1 and Y2. And active cell X1 is arranged on the right-hand side of the drawing (inside of cell arrangement) from inactive cell Y2.

For this reason, cell area A1 is a region where the cell was put in order in two dimensions, and from the inactive cell of the outermost periphery of cell area A1, peripheral region A2 is a region of a periphery, and can also be said to be the region to the end of a semiconductor chip. Henceforth, in this meaning, it explains using cell area A1 and peripheral region A2. When seeing at FIG. 4, a peripheral region will be called the peripheral part of semiconductor chip CHP.

In trench 6 of peripheral region A2, first gate electrode lead-out part 8G2 is formed via insulation film 7. And on first gate electrode lead-out part 8G2, second gate electrode lead-out part 10G2 is formed via insulation film 9. First gate electrode lead-out part 8G2 is electrically connected with first gate electrode 8G1, and second gate electrode lead-out part 10G2 is electrically connected with second gate electrode 10G1. First gate electrode lead-out part 8G2 and second gate electrode lead-out part 10G2 are electrically connected via contact CNT1, and make first gate electrode 8G1 and second gate electrode 10G1 the same electric potential.

On the main surface of substrate 1S, interlayer insulation film 16 is formed and contact hole 17 which reaches second gate electrode lead-out part 10G2 is formed from this interlayer insulation film 16. Contact hole 18 which reaches p type semiconductor layer 14 for channel formation is formed from interlayer insulation film 16. Contact hole 19 which reaches $p^+$ type semiconductor layer 20 is formed from interlayer insulation film 16. This contact hole 18 is in contact with $n^+$ type semiconductor layer 15 of cell area A1, and contact hole 19 is in contact with $n^+$ type semiconductor layer 15 of peripheral region A2.

Gate electrode wiring 21GL is formed so that contact hole 17 which reaches to second gate electrode lead-out part 10G2 from interlayer insulation film 16 may be embedded. Contact CNT2 is formed in this contact hole 17, and second gate electrode lead-out part 10G2 is electrically connected with gate electrode wiring 21GL by contact CNT2.

Source electrode 21S is formed so that contact hole 18 which reaches p type semiconductor layer 14 for channel formation from interlayer insulation film 16 may be embedded. Contact CNT3 will be formed in this contact hole 18. This contact CNT3 becomes the body contact to source potential.

Outermost periphery electrode wiring 21AL is formed so that contact hole 19 may be embedded. Contact CNT4 will be formed in this contact hole 19. This contact CNT4 becomes the body contact to drain potential. The region of the outside (counter direction side to cell area A1) of outermost periphery electrode wiring 21AL is a scribe region.

These source electrodes 21S, gate electrode wiring 21GL, and outermost periphery electrode wiring 21AL comprise a laminated film of the barrier metal film and the metallic film. A barrier metal film consists of a titanium tungsten (TiW) film, for example, and a metallic film consists of an aluminum film or an aluminum alloy film, for example.

Source electrode 21S touches $n^+$ type semiconductor layer 15 through the side surface of contact hole 18 which reaches p type semiconductor layer 14 for channel formation. Hereby, source electrode 21S is electrically connected with $n^+$ type semiconductor layer 15. p⁺ type semiconductor layer 20 is formed in the bottom of contact hole 18, and source electrode 21S is electrically connected with p type semiconductor layer 14 for channel formation through this p⁺ type semiconductor layer 20. Similarly, outermost periphery electrode wiring 21AL which forms a channel stopper touches n⁺ type semiconductor layer 15 through the side surface of contact hole 19 which reaches n⁻ type epitaxial layer 2. Hereby, outermost periphery electrode wiring 21AL is electrically connected with n⁺ type semiconductor layer 15.

On the main surface of substrate 1S on which source electrode 21S, gate electrode wiring 21GL, and outermost periphery electrode wiring 21AL were formed, the polyimide resin film is formed as surface protection film 25. And on source pad SP which is a part of source electrodes 21S, surface protection film 25 was removed and source pad SP has exposed. Drain electrode 26D is formed in the back surface (second surface) of the opposite side of the main surface (first surface) of substrate 1S. Drain electrode 26D comprises laminated film 26 of a titanium (Ti) film, a nickel (Ni) film, and a gold (Au) film, for example.

Figure 3:
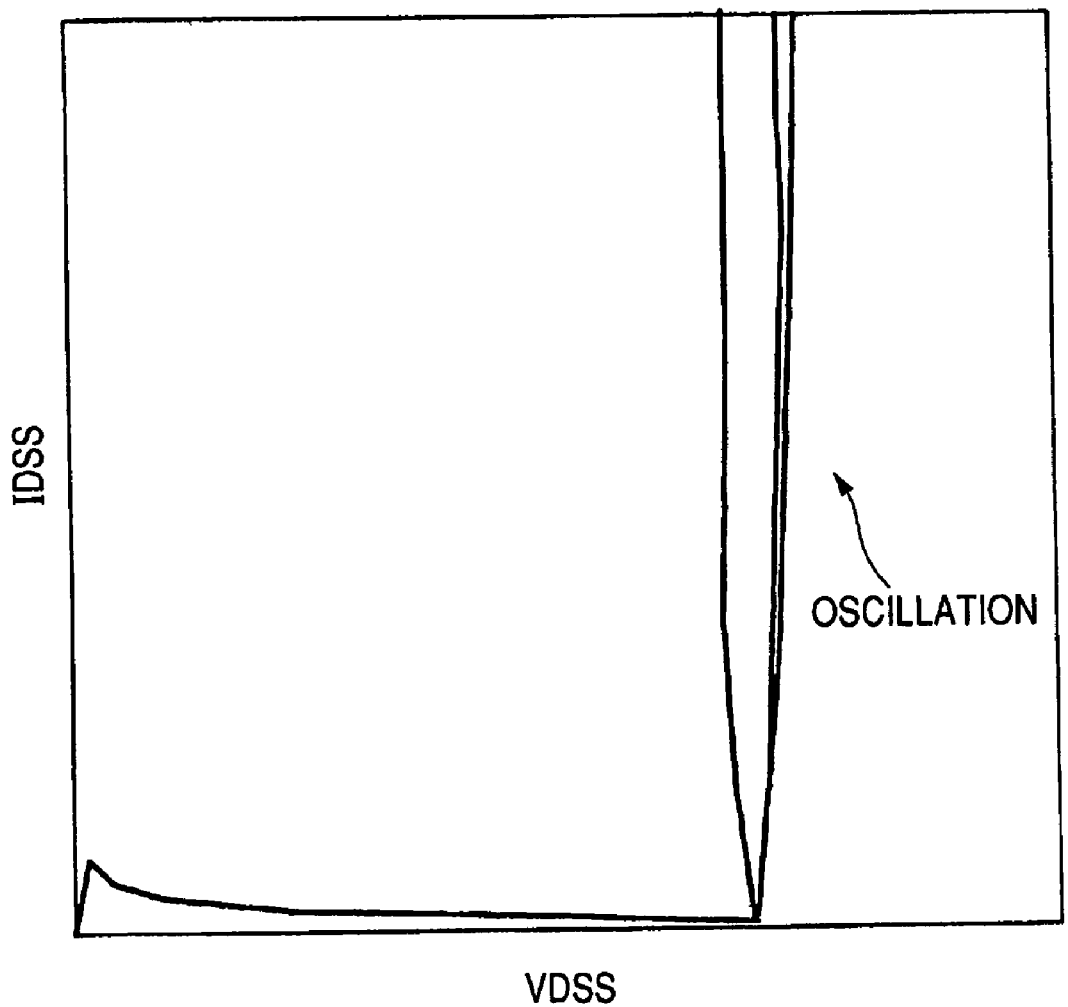
FIG. 3 is an element breakdown voltage wave form chart of the semiconductor device which present inventors examined.
Figure 12:
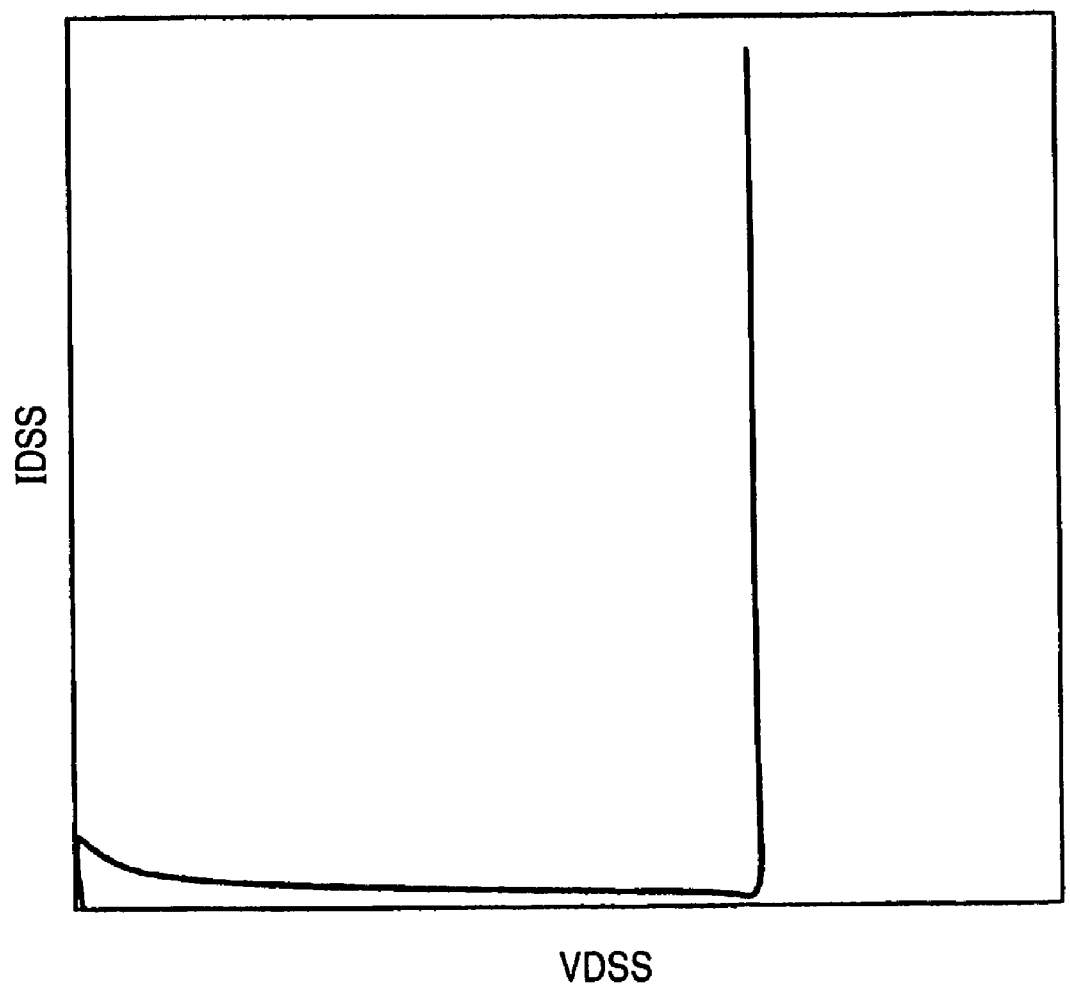
FIG. 12 is an element breakdown voltage wave form chart of the semiconductor device in Embodiment 1 of the present invention.

In the semiconductor device of Embodiment 1, 0V is applied between second gate electrode 10G1 and source electrode 21S (second gate electrode 10G1 and n⁺ type semiconductor layer 15 of the source region are grounded). The result of having measured the wave form of the breakdown voltage of drain electrode 26D and source electrode 21S, i.e., drain source breakdown voltage which is an element breakdown voltage of power MISFET, (BVDSS) is shown in FIG. 12. As shown in FIG. 12, the phenomenon to oscillate (unstabilize) of FIG. 3 confirmed by the element breakdown voltage wave form which present inventors examined is suppressed.

Figure 2:
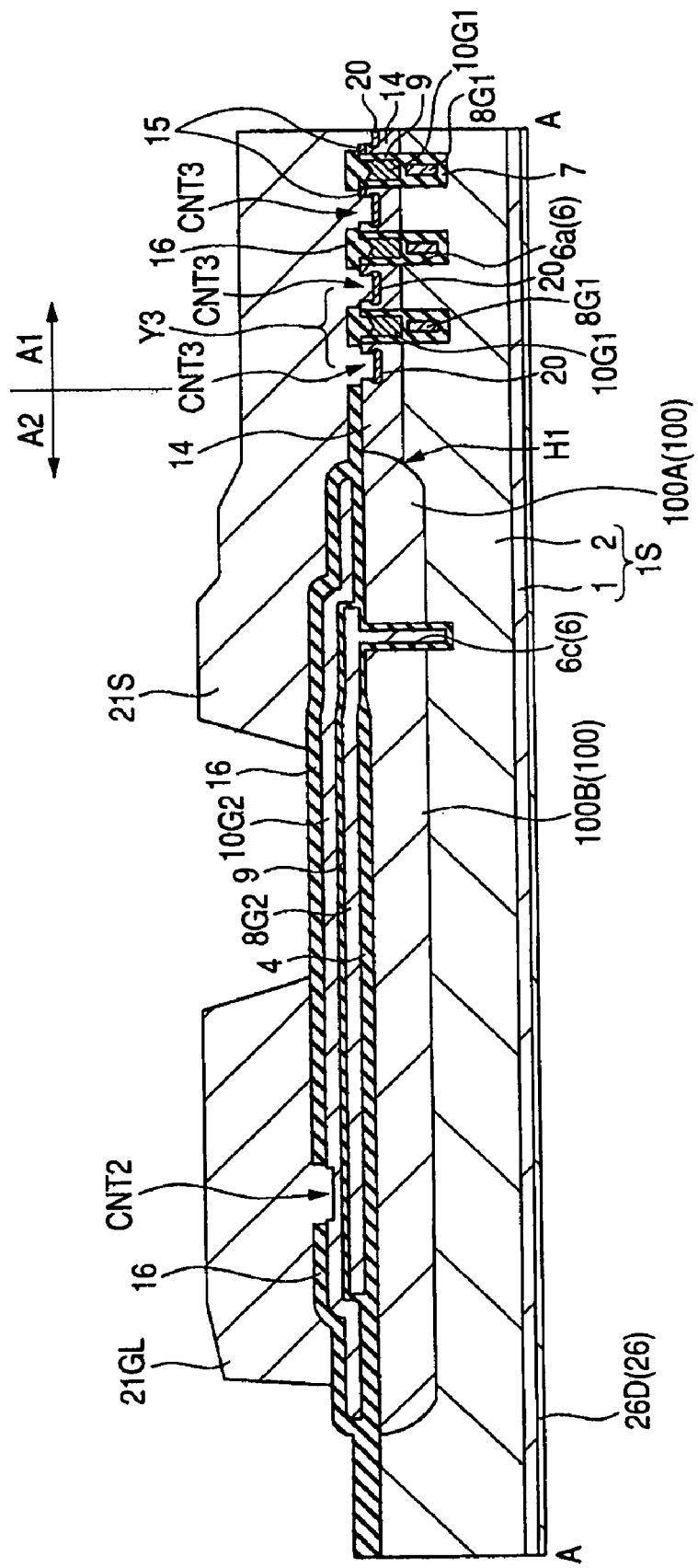
FIG. 2 is a cross-sectional view in the A-A line of FIG. 1.

As a cause that an oscillation phenomenon generates, as mentioned above, when trench 6 is deeper than p⁻ type well 100, it becomes the structure where p⁻ type well 100 is divided by trench 6 (refer to FIG. 1 and FIG. 2). Since the part where p⁻ type well 100 was divided is high impedance when an element breakdown voltage is measured, it is thought that it may be in a floating state effectually.

So, in Embodiment 1, as shown, for example in FIG. 7, connection trench 6c which connects the termination of trench 6 (leading trench 6b) of peripheral region A2 is made the pattern which connects leading trench 6b in a pair (every two pieces). The whole will be fixed to source potential (ground potential) via contact CNT3, and p⁻ type well 3 is kept from forming the portion used as a floating state by this.

Since trench 6 (leading trench 6b) of peripheral region A2 is formed in the shape of a straight line toward the end portion from the central part of chip CHP as FIG. 4 and FIG. 6 showed, when the plane form of chip CHP is rectangular shape, the region in which trench 6 is not formed is made in the four corners. Contact CNT5 which fixes p⁻ type well 3 to source potential (ground potential) is formed in this region. p⁻ type well 3 can be fixed to source potential (ground potential) via contact CNT5 from four corners by this, and the portion which will be in a floating state in p⁻ type well 3 is trying not to be formed. A chip area can be reduced by forming contact CNT5 in the four corners of chip CHP in which trench 6 is not formed rather than the case where contact of floating prevention is formed in the chip end portion except the four corners of chip CHP.

Next, although double gated structure was adopted and first gate electrode 8G1 is formed in power MISFET in Embodiment 1, the function as a dummy gate electrode of this first gate electrode 8G1 is explained.

Where a gate electrode and the source region are grounded in the case of power MISFET which has not formed first gate electrode 8G1, when voltage is applied to a drain region, an electric field will become strong most at the bottom of the trench in which the gate electrode is formed. Therefore, the breakdown voltage (BVDSS) of power MISFET is determined on the voltage to which avalanche breakdown happens near the bottom of the trench. Since there is only a comparatively thin gate insulating film in the bottom of this trench, the electric field between a gate and a drain becomes stronger easily.

On the other hand, in the case of power MISFET which formed first gate electrode 8G1 as shown in FIG. 8, although the electric field in the bottom of trench 6 of first gate electrode 8G1 becomes the strongest easily, since there is insulation film 7 thicker than insulation film 9, it is easy to ease the electric field between first gate electrode 8G1 and a drain region. Therefore, the pn junction breakdown voltage in cell area A1 becomes high, and a breakdown voltage (BVDSS) can be improved compared with power MISFET which has not formed first gate electrode 8G1.

Figure 13:
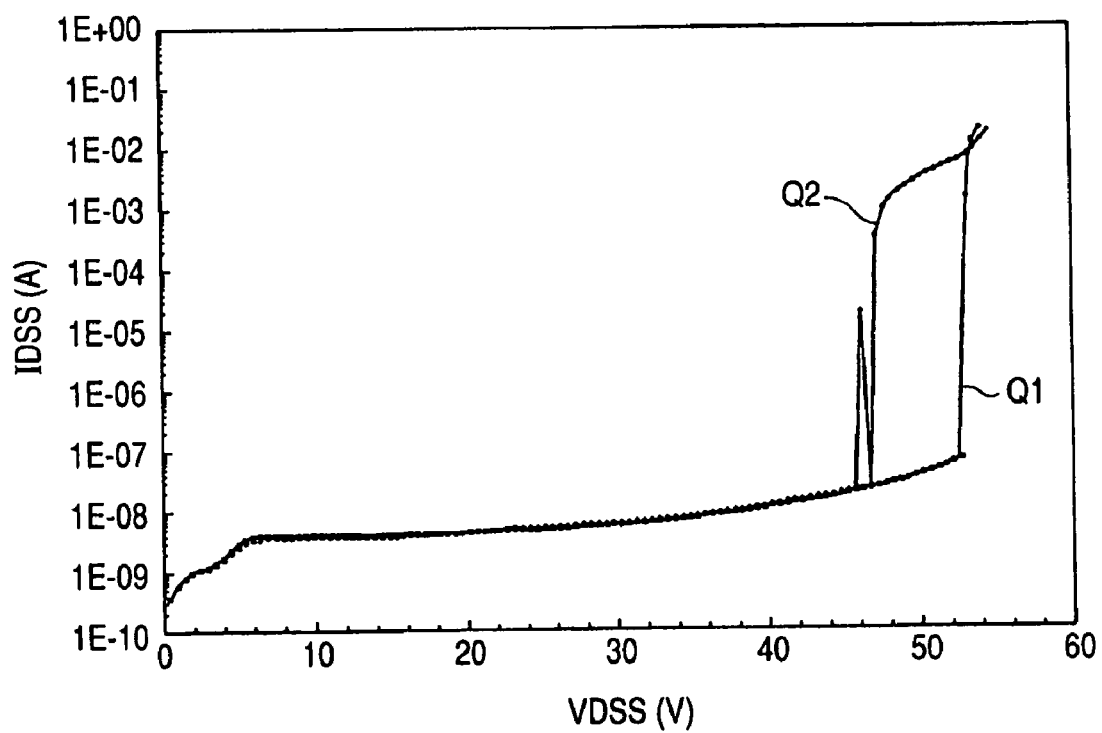
FIG. 13 is the element breakdown voltage wave form chart which compared the semiconductor device of Embodiment 1 of the present invention with the semiconductor device which present inventors examined.

Here, the result of having compared the breakdown voltage wave form of the semiconductor device (Q1) in Embodiment 1, and the semiconductor device which present inventors examined (Q2) shown by FIGS. 1 and 2 is shown in FIG. 13. Double gated structure is adopted also in the semiconductor device (Q2) which present inventors examined, and the pn junction breakdown voltage in cell area A1 is made high according to the electric field relaxation effect of first gate electrode 8G1. However, as shown in FIG. 13, when the element breakdown voltage of the whole including peripheral region A2 is compared, the element breakdown voltage of the semiconductor device (Q2) is lower than the element breakdown voltage of a semiconductor device (Q1).

Since double gated structure is adopted in both cell areas A1 of the semiconductor device (Q1) and the semiconductor device (Q2), since the breakdown voltage is low, with the semiconductor device (Q2), it is thought with the structure of peripheral region A2 that the element breakdown voltage is falling. Conversely, with the semiconductor device (Q1), since the breakdown voltage is high with the structure of peripheral region A2 compared with the semiconductor device (Q2), it will be thought that the element breakdown voltage has improved.

It is thought that it is especially easy to discover this phenomenon to the semiconductor device which has device structures, such as double gated structure, super junction structure, etc. which were devised so that a cell breakdown voltage could improve.

As a reason the breakdown voltage has been improved with the semiconductor device (Q1), two can mainly be considered. One is having changed the boundary of the region of p⁻ type well 3, and the region of p type semiconductor layer (channel region) 14. Another is based on the combination of the above-mentioned boundary and double gated structure. However, it is thought that the breakdown voltage of bordering change improves without adopting the double gate. In order to improve the breakdown voltage more, it is thought that both are adopted.

First, the boundary of the region of p⁻ type well 3 and the region of channel 14 is explained. Compared with cell area A1, a device design is considered so that the breakdown voltage minimum of a device may not be rate-controlled under the influence of the breakdown voltage of peripheral region A2. Here, in cell area A1, it is a pn junction breakdown voltage of p type semiconductor layer (channel region) 14 and n⁻ type epitaxial layer 2 which is taken into consideration as a breakdown voltage. In peripheral region A2, it is a pn junction breakdown voltage of p⁻ type well 3 and n⁻ type epitaxial layer 2.

Since n⁻ type epitaxial layer 2 is common in cell area A1 and peripheral region A2, the breakdown voltage depends on the difference of p type semiconductor layer (channel region) 14 and p⁻ type well 3, respectively. What is necessary is just to make low p type impurity concentration of p⁻ type well 3, for example compared with p type semiconductor layer (channel region) 14, in order to improve the breakdown voltage of peripheral region A2 compared with cell area A1. When p type impurity concentration is too low, since a breakdown voltage may become low by the elongation of a depletion layer, p type impurity concentration of p⁻ type well 3 will be made higher than p type semiconductor layer (channel region) 14 in this case. That is, the structure of p⁻ type well 3 changes with conditions, such as impurity concentration, an impurity profile, etc. of p type semiconductor layer (channel region) 14. Therefore, it can be said that the breakdown voltage of a device is improved because impurity layer structure, such as an impurity profile, the depth and concentration of an impurity, and an impurity concentration peak value, makes it what is different between p type semiconductor layer (channel region) 14 and p⁻ type well 3.

When doing another view and p type semiconductor layer (channel region) 14 of cell area A1 and p⁻ type well 3 of peripheral region A2 will be made into the same structure, the breakdown voltage at the side of peripheral region A2 will fall. Two things can be considered about this. It is because a well boundary is made in peripheral region A2 as for one, there will be a round region on which an electric field tends to concentrate on the boundary and this becomes a region which determines the breakdown voltage. Another is because it is in the tendency for the pn junction breakdown voltage of p type semiconductor layer (channel region) 14 and n⁻ type epitaxial layer 2 to become better than peripheral region A2 by the influence of the gate electrode in the trench of cell area A1. This is based on the field plate effect of the gate electrode. Although this effect is especially large in double gated structure, it is thought that it will appear when a narrowing of a pitch is done also with single gate structure. Therefore, since the breakdown voltage of peripheral region A2 will fall when p type semiconductor layer (channel region) 14 of cell area A1 and p⁻ type well 3 of peripheral region A2 are made into the same impurity layer structure, it does not have the same structure.

In the example of FIG. 8, the position from a substrate front surface of the pn junction of p type semiconductor layer (channel region) 14 and n⁻ type epitaxial layer 2, and the position from a substrate front surface of the pn junction of p⁻ type well 3 and n⁻ type epitaxial layer 2 are changed. Since the radius of curvature of a round becomes large by making p⁻ type well 3 deep from the substrate front surface, the breakdown voltage improves.

In consideration of the above contents, the breakdown voltage structure of peripheral region A2 shown by FIG. 1 and FIG. 2 is examined. In the example of analyses, as shown in FIG. 2, boundary H1 of p type semiconductor layer (channel region) 14 and p⁻ type well 100 is between inactive cell Y3 of the end of cell area A1, and the semiconductor chip end which is at the left end of a drawing. Boundary H1 is between inactive cell Y3 of the end of cell area A1, and connection trench 6c in more detail here. As mentioned above, the pn junction breakdown voltage of p⁻ type well 3 and n⁻ type epitaxial layer 2 is higher than the pn junction breakdown voltage of p type semiconductor layer (channel region) 14 and n⁻ type epitaxial layer 2. Conversely, the pn junction breakdown voltage of p type semiconductor layer (channel region) 14 and n⁻ type epitaxial layer 2 will be low.

From boundary H1 to inactive cell Y3, there is a portion with a distance far compared with the distance between cells in cell area A1 from the gate electrode in the trench of inactive cell Y3. In this portion, it becomes difficult to be influenced by a gate electrode, and becomes difficult to generate the improvement in a breakdown voltage by a gate electrode. From this reason, it is thought in the portion on the left of inactive cell Y3 of FIG. 2 that the element breakdown voltage minimum was decided by the pn junction breakdown voltage of p type semiconductor layer (channel region) 14 and n⁻ type epitaxial layer 2.

So, in the present invention, as shown, for example in FIG. 8, the end (boundary H2 of p⁻ type well 3 and p type semiconductor layer 14) of p⁻ type well 3 is formed between cell trenches 6a of cell area A1. It is prevented that the pn junction of p type semiconductor layer 14 and n⁻ type epitaxial layer 2 was formed in peripheral region A2.

Hereby, since boundary H2 is sandwiched between inactive cells Y1 and Y2 of FIG. 8, the sandwiched region is influenced by a gate electrode, and can suppress lowering of the pn junction breakdown voltage of p type semiconductor layer 14 and n⁻ type epitaxial layer 2.

Here, in order to prevent lowering of an element breakdown voltage, the end (boundary H2) of p⁻ type well 3 is needed to form p⁻ type well 3 so that it may be applied to of cell area A1 at least. That is, it is made for the end of p⁻ type well 3 to touch the inactive cell of an outermost periphery at least.

And the combination of the above-mentioned boundary H2 and double gated structure which is another reason is described below. According to the effect (the field plate effect) of the electric field relaxation of the double gated structure mentioned above being large, the breakdown voltage in the boundary H2 neighborhood can be further improved compared with the usual single gate structure.

Thus, at FIG. 13, characteristics are improving by two, the electric field relaxation effect by double gated structure, and the breakdown voltage effect by forming the boundary of p type semiconductor layer 14 and p⁻ type well 3 between cells.

In addition, for example, although the case where one cell trench 6a which forms the inactive cell in cell area A1 is formed in p⁻ type well 3 is shown by FIG. 8, cell trench 6a which forms a plurality of inactive cells may be formed in p⁻ type well 3.

As for the pn junction formed by p type semiconductor layer 14 which forms a channel region, and n⁻ type epitaxial layer 2 which forms a drain region (drift region), since emphasis is put on designing which optimizes the cell characteristics of power MISFET, there is a limit in securing breakdown voltage sufficient in that a breakdown voltage is secured. However, in the pn junction formed by p⁻ type well 3 and n⁻ type epitaxial layer 2, a power MISFET cell is independent and the specification of p⁻ type well 3 can be designed. That is, concentration and the depth can be adjusted independently. Therefore, it becomes comparatively easy to make high the breakdown voltage of peripheral region A2.

Thus, the breakdown voltage change and degradation as whole power MISFET (semiconductor device) can be suppressed by designing the breakdown voltage of peripheral region A2 to become higher enough than the breakdown voltage of cell area A1.

Although it becomes a repeat, in the above-mentioned example, gate structure is applicable also to the single gate which becomes at the usual gate, although the double gate was shown in the example. The case of the embodiment mentioned later may also be single gate structure.

Next, the manufacturing method of the semiconductor device in Embodiment 1 of the present invention is explained in order with reference to FIG. 14-24. FIG. 14-24 are the principal part cross-sectional views of the semiconductor device in a manufacturing process, and are a cross-sectional view of the A-A line of the FIG. 5 shown as a principal part plan view of a semiconductor device. Reference A1 in FIG. 14-24 shows the cell area in which power MISFET which is a gate control type semiconductor element is formed, and A2 shows the peripheral region contiguous to the cell area.

Figure 14:
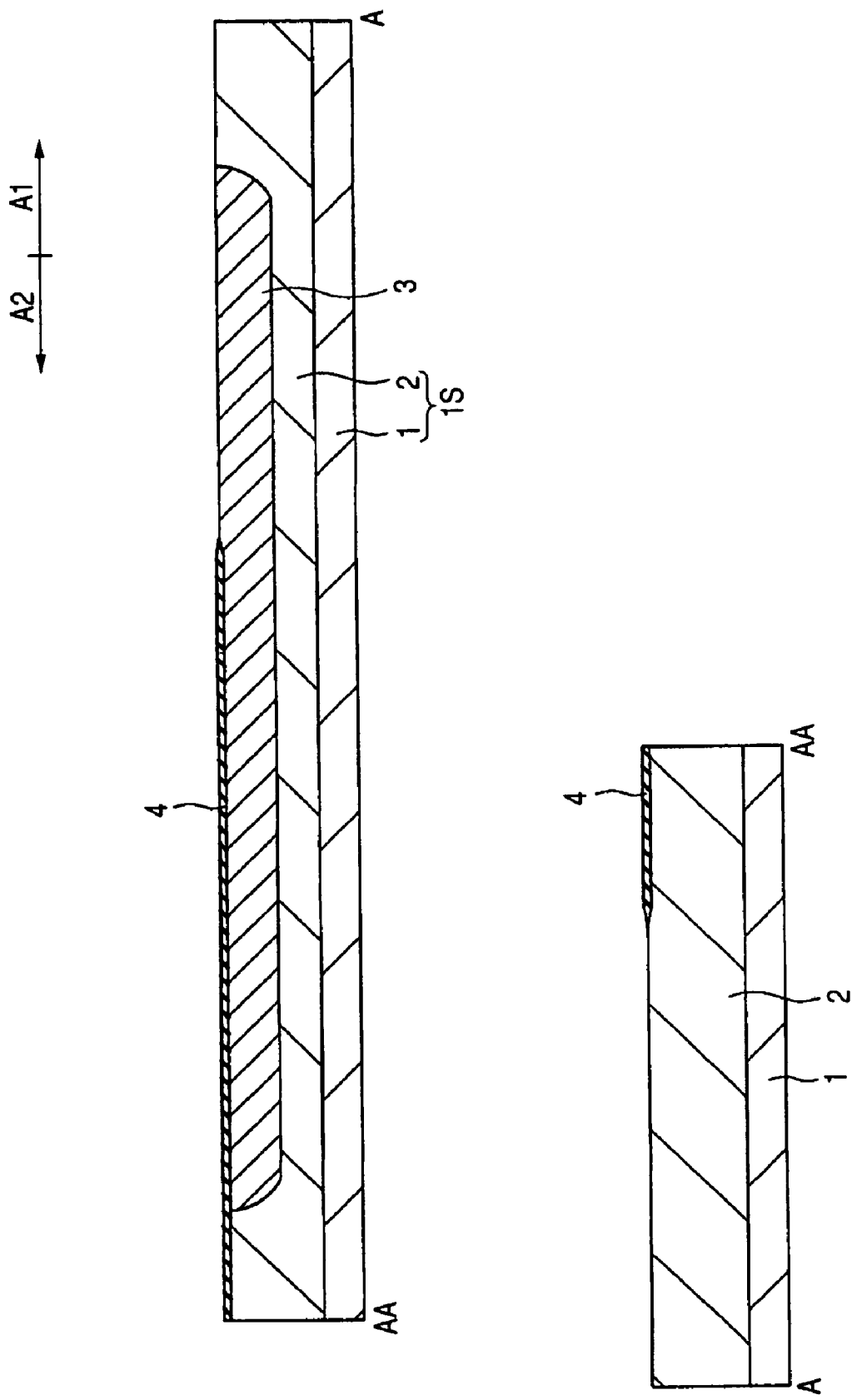
FIG. 14 is a principal part cross-sectional view of the semiconductor device in the manufacturing process in Embodiment 1 of the present invention.

First, as shown in FIG. 14, the thing in which n⁻ type epitaxial layer (first semiconductor layer) 2 which consists of high resistance n⁻ type (first conductivity type) silicon single crystal was formed on semiconductor substrate 1 which consists of low resistance n⁺ type (first conductivity type) silicon (Si) single crystal is prepared. In the following explanation, it is set as epitaxial substrate (merely henceforth a substrate) 1S by which n⁻ type epitaxial layer 2 was formed on these semiconductor substrates 1. This substrate 1S has a main surface (first surface) which is an element formation surface, and a back surface (second surface) on the reverse side, and power MISFET is formed in the main surface. n⁻ type epitaxial layer 2 is formed in the main surface side of substrate 1S, and forms the drain region (drift region) of power MISFET.

Then, p⁻ type well (third semiconductor layer) 3 is formed in n⁻ type epitaxial layer 2 by introducing p type (second conductivity type) impurities, such as boron (B), using photolithography technology and ion implantation. In the case, p⁻ type well 3 is formed so that it may be applied to the boundary of cell area A1 and peripheral region A2. That is, one end of p⁻ type well 3 is formed in cell area A1, and the other end is formed in peripheral region A2. This p⁻ type well 3 is formed in order to make pn junction with a high breakdown voltage.

Then, a selective oxidation method (the LOCOS method) is used, for example, and insulation film 4 used as an element isolation region is formed. This insulation film 4 is formed, for example from a silicon oxide film.

Figure 15:
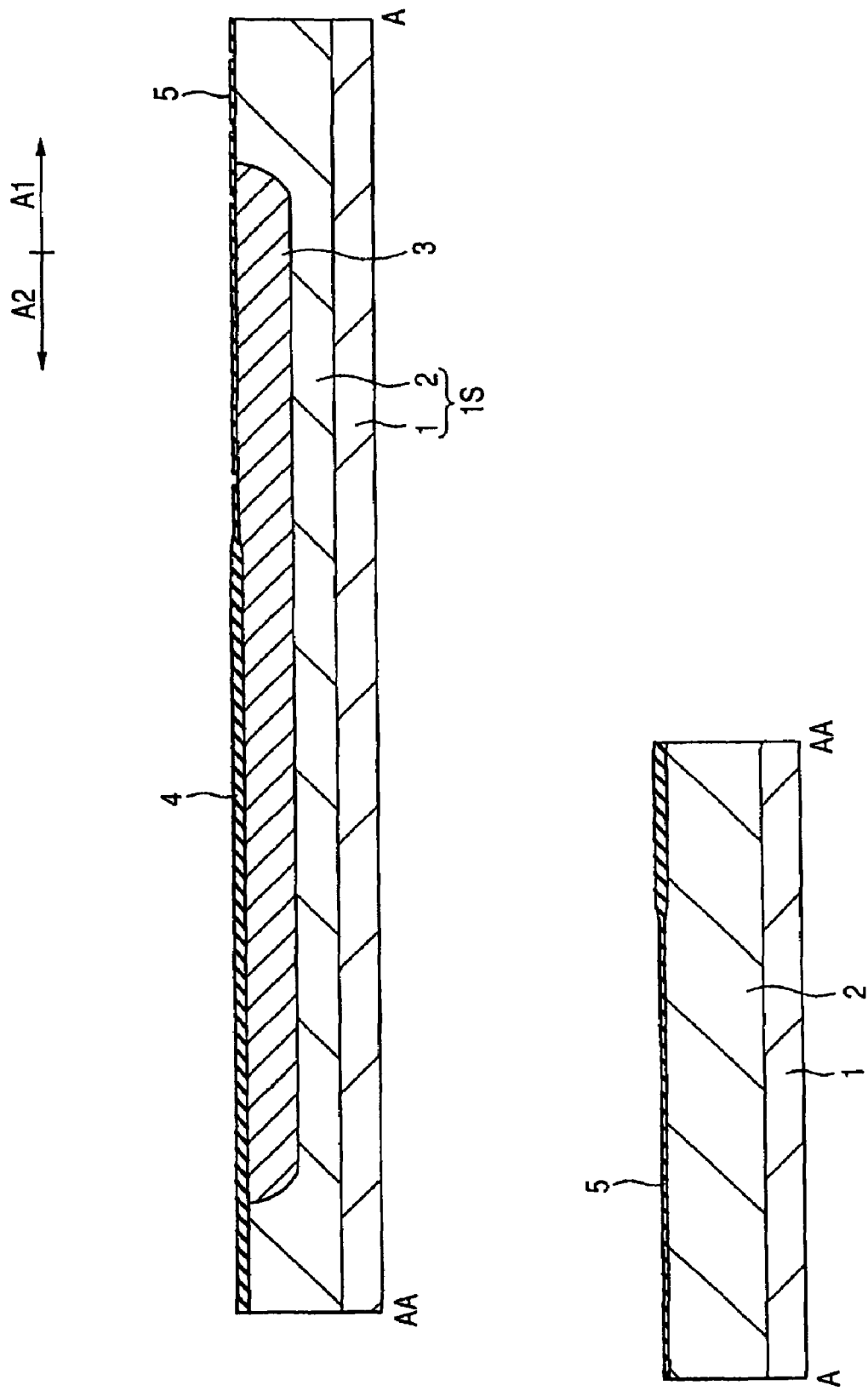
FIG. 15 is a principal part cross-sectional view of the semiconductor device in the manufacturing process following FIG. 14.

Then, as shown in FIG. 15, after forming insulation film 5 which consists of a silicon oxide film on the main surface of substrate 1S, for example, the insulation film 5 is patterned. As for patterning, a resist pattern is formed on insulation film 5 through a series of photolithography technology like the application of a photoresist film (merely henceforth a resist film), exposure, and development. And insulation film 5 for trench formation is patterned by using this resist pattern as an etching mask, etching insulation film 5, and removing a resist pattern further. The pattern of this insulation film 5 has a function as a hard mask film for trench formation. Here, although a silicon oxide film is used, other materials, such as a silicon nitride film (Si₃N₄) formed by the CVD (Chemical Vapor Deposition) method, may be used.

Figure 16:
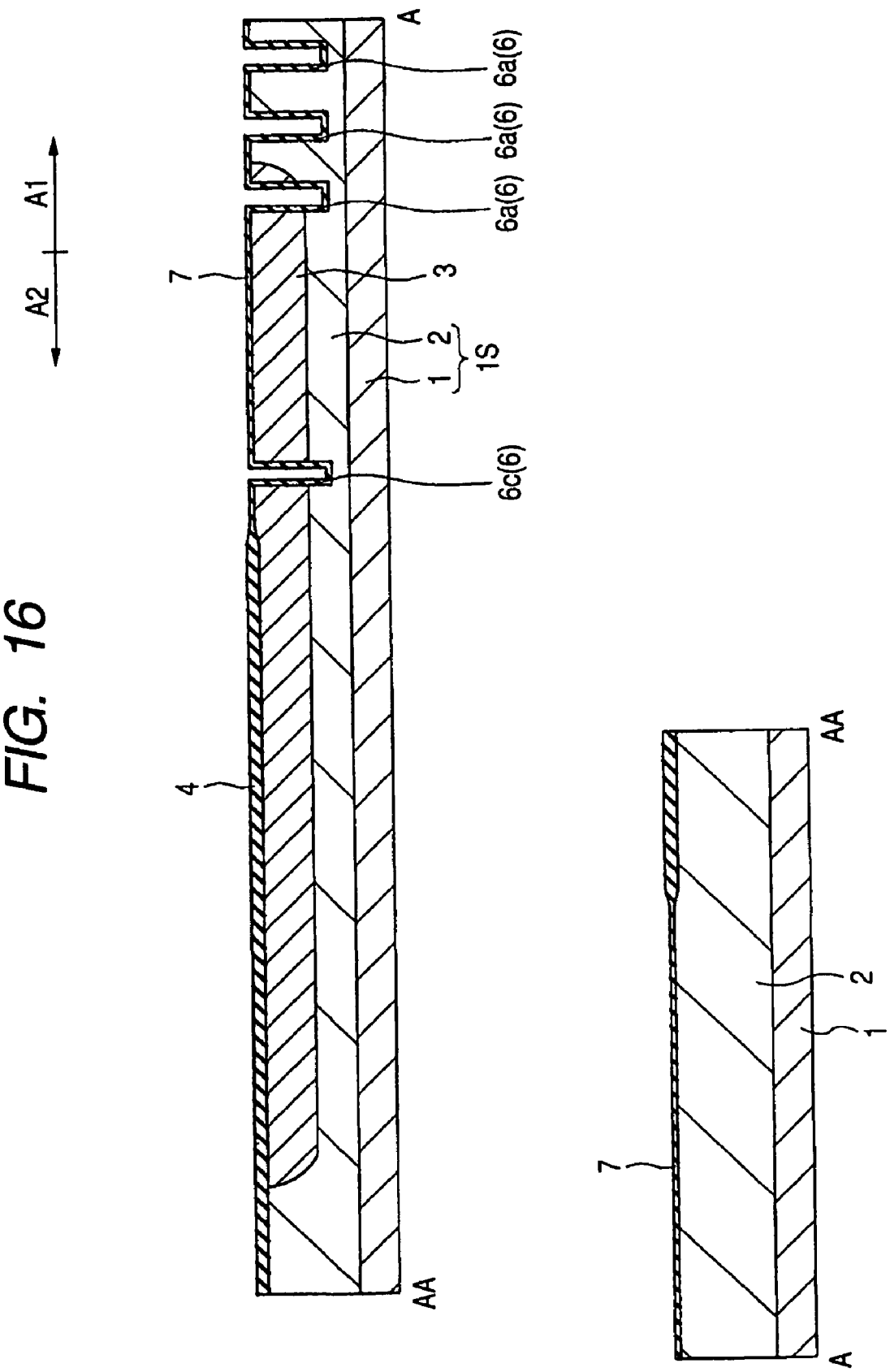
FIG. 16 is a principal part cross-sectional view of the semiconductor device in the manufacturing process following FIG. 15.

Then, as shown in FIG. 16, the pattern of insulation film 5 is used as an etching mask, substrate 1S is etched by anisotropic dry etching, and trench 6 is formed. In the case, as shown in FIG. 7, a plurality of cell trenches 6a in which the gate electrode of power MISFET is formed are formed among trenches 6 in cell area A1 so that they may become a ladder-like mesh pattern. A plurality of leading trenches 6b prolonged in the direction of peripheral region A2 from cell area A1 among trenches 6 in peripheral region A2, and connection trench 6c which connects the termination of a plurality of leading trenches 6b are formed.

Then, insulation film (first insulation film) 7 which consists of a silicon oxide film, for example is formed by performing thermal oxidation processing to substrate 1S on the main surface (the inner surface of trench 6 is included) of substrate 1S. The thickness of this insulation film 7 is about 200 nm, for example.

Figure 17:
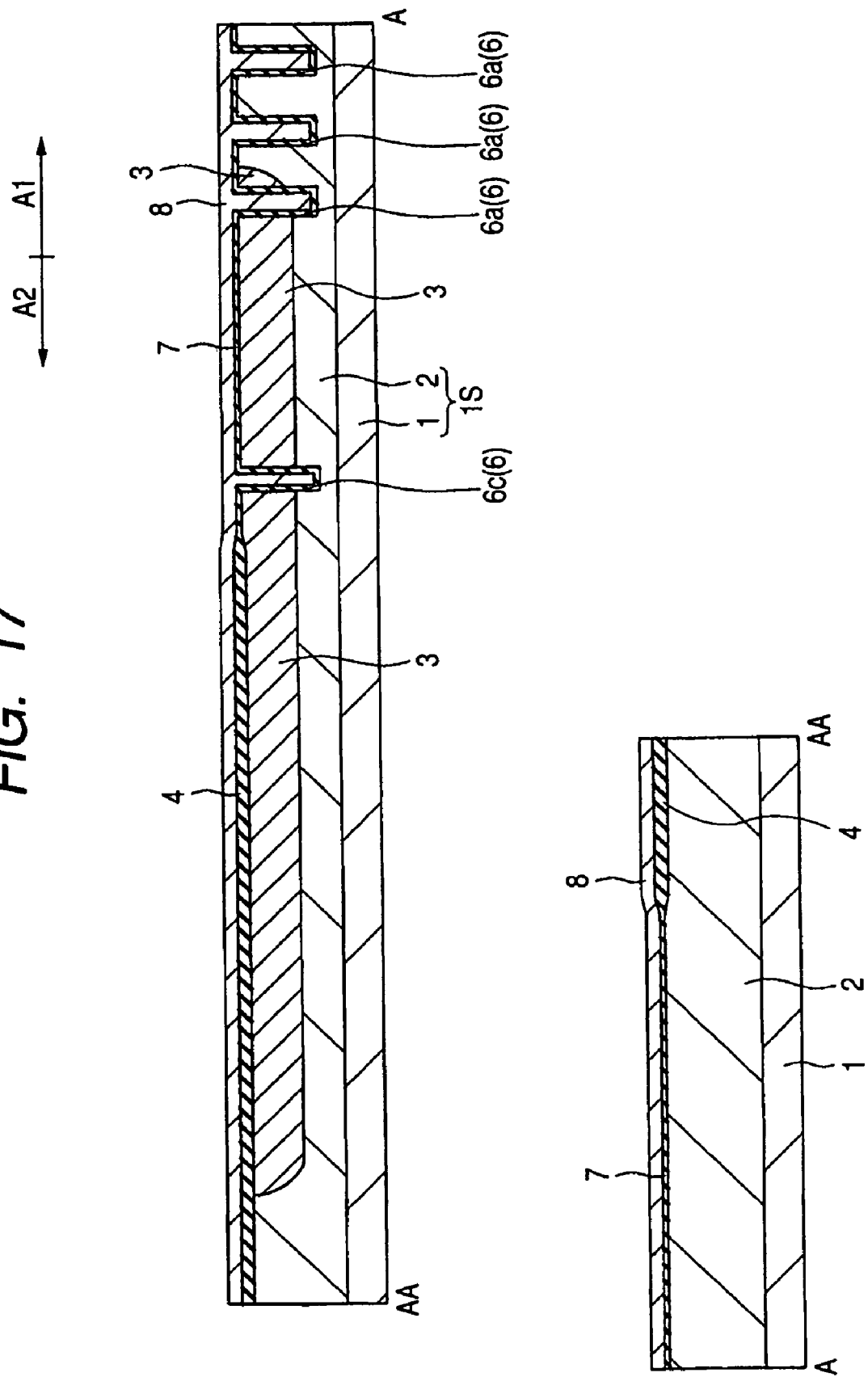
FIG. 17 is a principal part cross-sectional view of the semiconductor device in the manufacturing process following FIG. 16.

Then, as shown in FIG. 17, conductive film (first conductive film) 8 is formed on the main surface of substrate 1S. After introducing the impurity of n type of phosphorus (P), arsenic (As), or antimony (Sb) into the intrinsic polysilicon film formed, for example by the CVD method without introducing a conductivity type impurity, using ion implantation, this conductive film 8 is formed by heat-treating more than 1100° C. to substrate 1S (annealing treatment).

Figure 18:
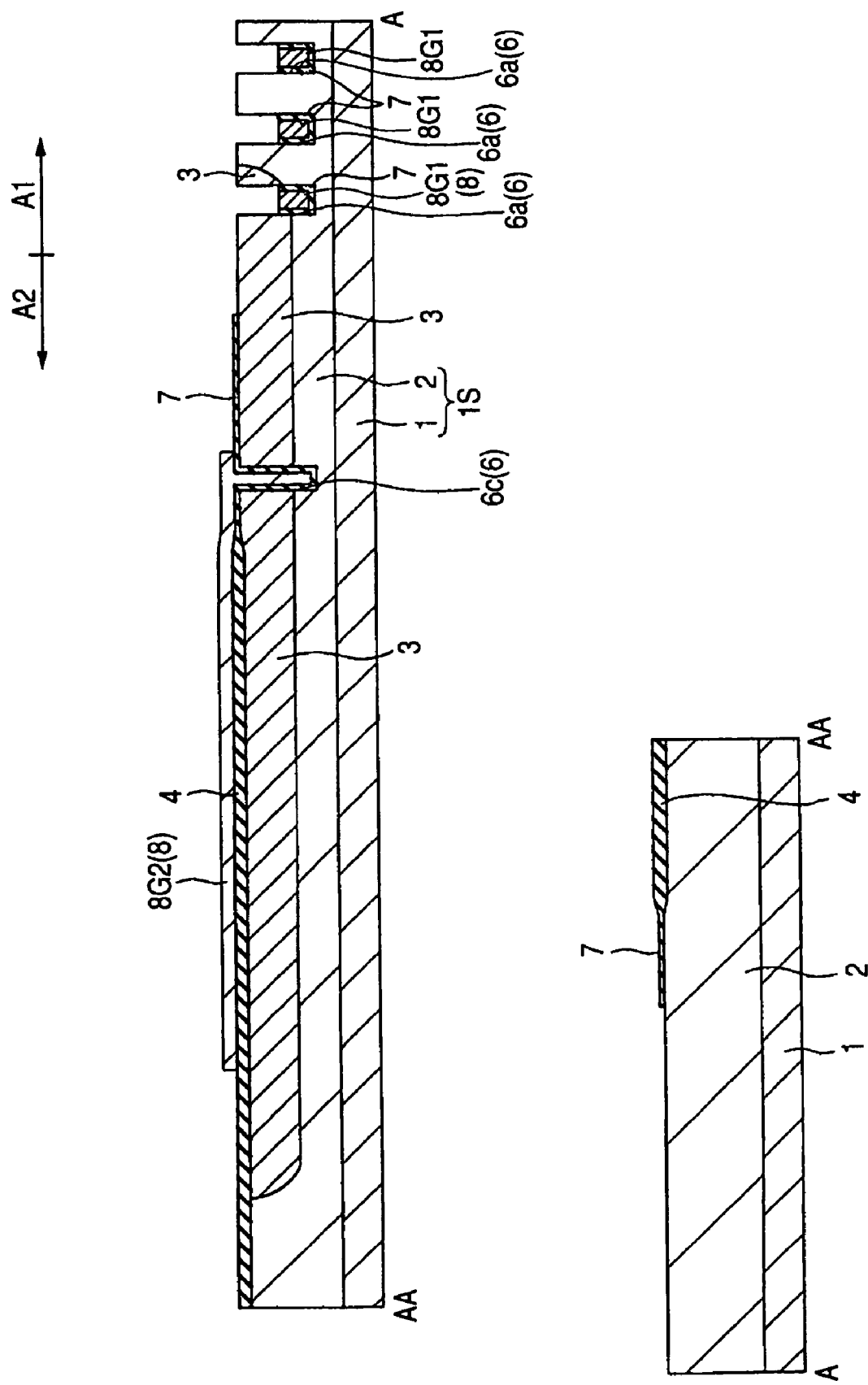
FIG. 18 is a principal part cross-sectional view of the semiconductor device in the manufacturing process following FIG. 17.

Then, as shown in FIG. 18, conductive film 8 is patterned using photolithography technology and etching technology, and insulation film 7 is patterned after that using photolithography technology and etching technology. This etches conductive film 8 currently formed in trench 6 to the intermediate depth, and first gate electrode (in Embodiment 1, it becomes dummy gate electrode) 8G1 is formed in trench 6. First gate electrode lead-out part 8G2 is formed on substrate 1S by patterning. First gate electrode lead-out part 8G2 is formed so that it may electrically connect with first gate electrode 8G1. Here, the grain size of the polysilicon film which forms conductive film 8 is enlarged by heat treatment mentioned above. For this reason, the effect that the defect of shape of first gate electrode 8G1 can be prevented is also acquired.

Figure 19:
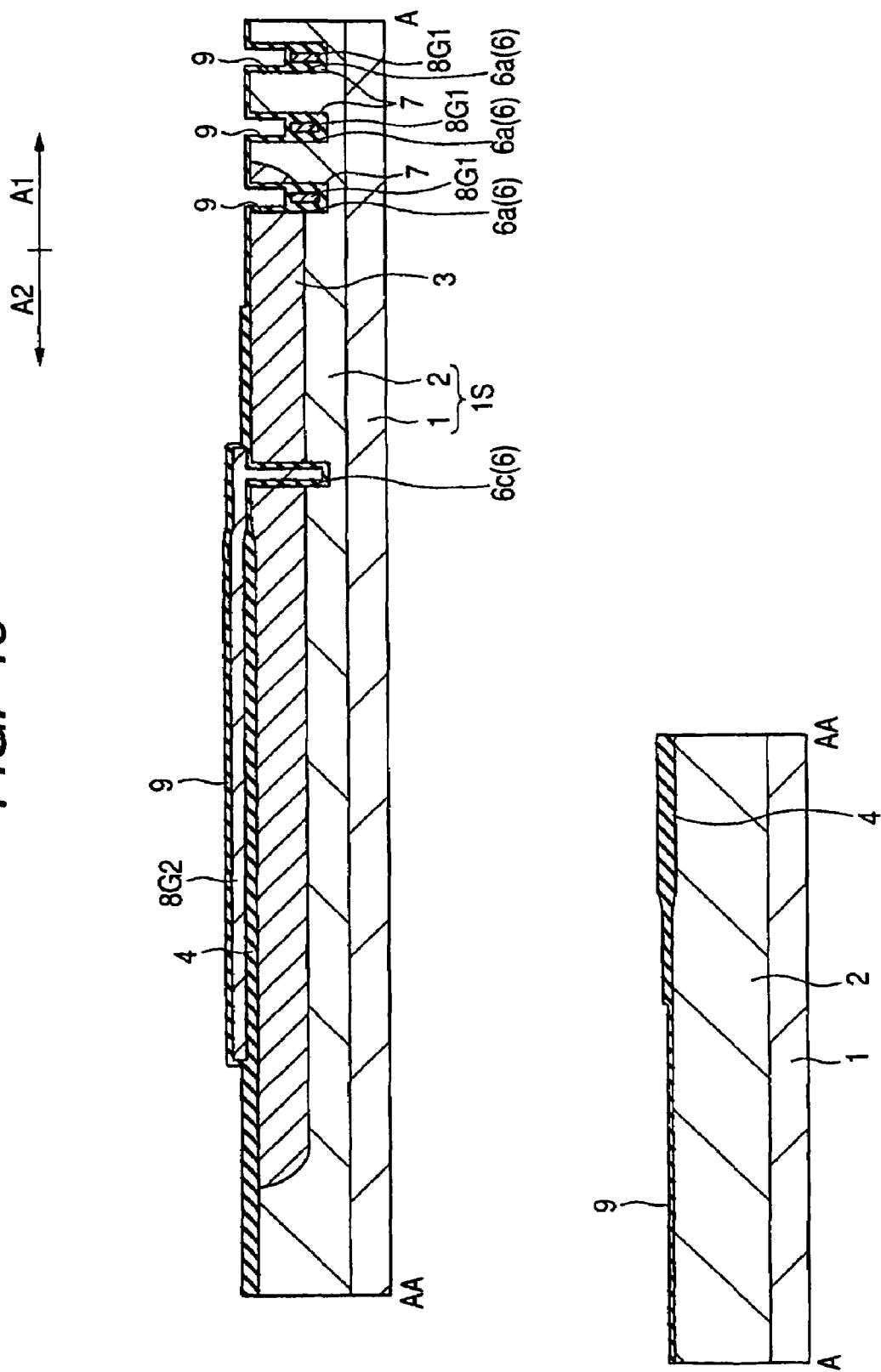
FIG. 19 is a principal part cross-sectional view of the semiconductor device in the manufacturing process following FIG. 18.

Then, as shown in FIG. 19, insulation film (second insulation film) 9 used as a gate insulating film is formed on the main surface of substrate 1S including the side surface of trench 6. This insulation film 9 is formed so that it may consist of a silicon oxide film formed, for example of thermal oxidation processing and may become thin compared with insulation film 7. This is required in order to improve the current drive capability of power MISFET and to lower on resistance. The thickness of insulation film 9 is about 50 nm, for example.

Figure 20:
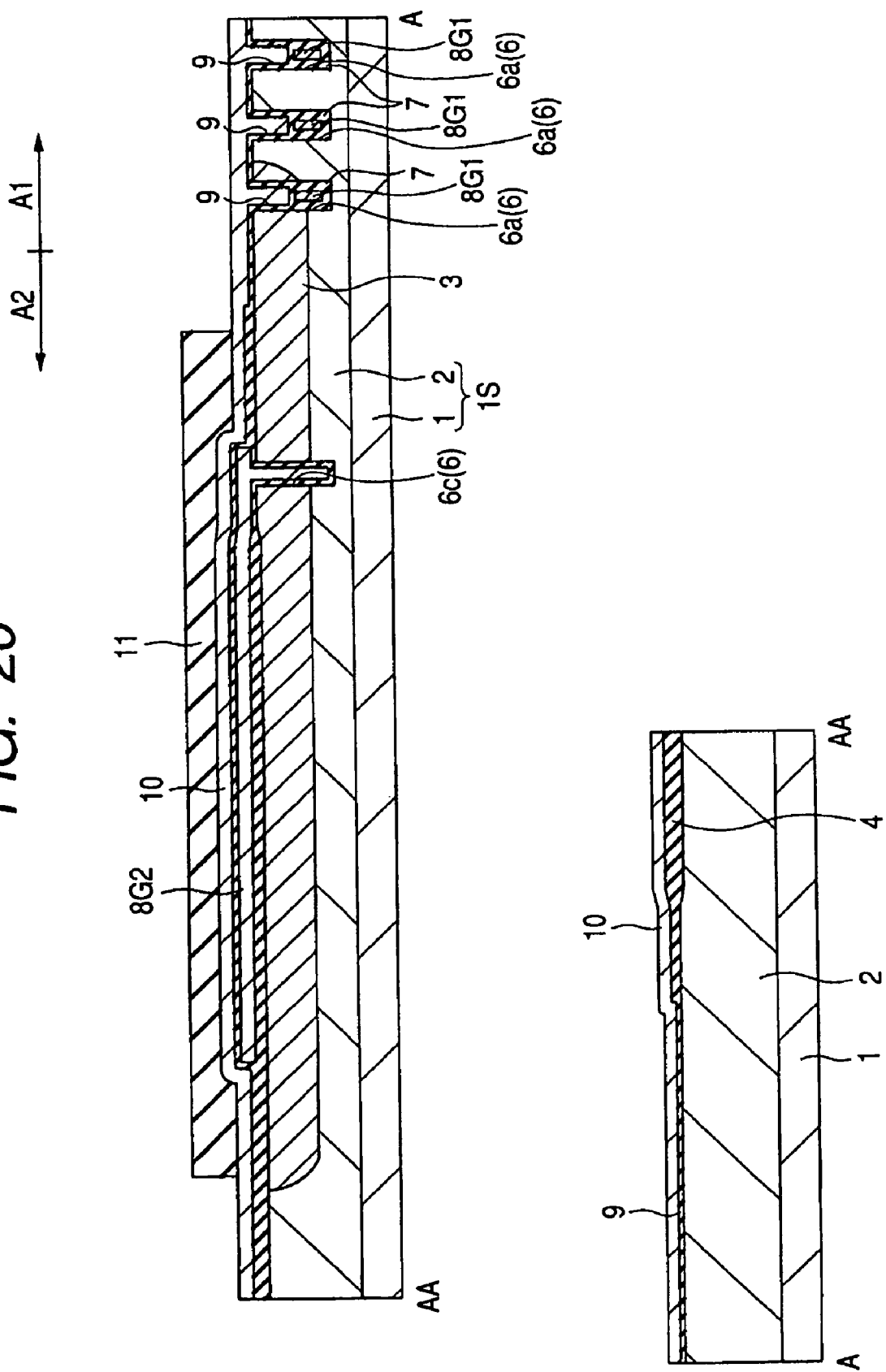
FIG. 20 is a principal part cross-sectional view of the semiconductor device in the manufacturing process following FIG. 19.

Then, as shown in FIG. 20, conductive film (second conductive film) 10 is formed on substrate 1S including insulation film 9 upper part. A CVD method is used for this conductive film 10, for example, and it consists of a polysilicon film in which the n type impurity was added. That is, when forming this polysilicon film, the impurity of n types, such as phosphorus and arsenic, is introduced in the polysilicon film, for example.

Then, resist film 11 is applied on the main surface of substrate 1S, the photolithography technology of performing exposure and development is used, and resist film 11 is patterned. The pattern of this resist film 11 has a function as a mask for second gate electrode formation.

Figure 21:
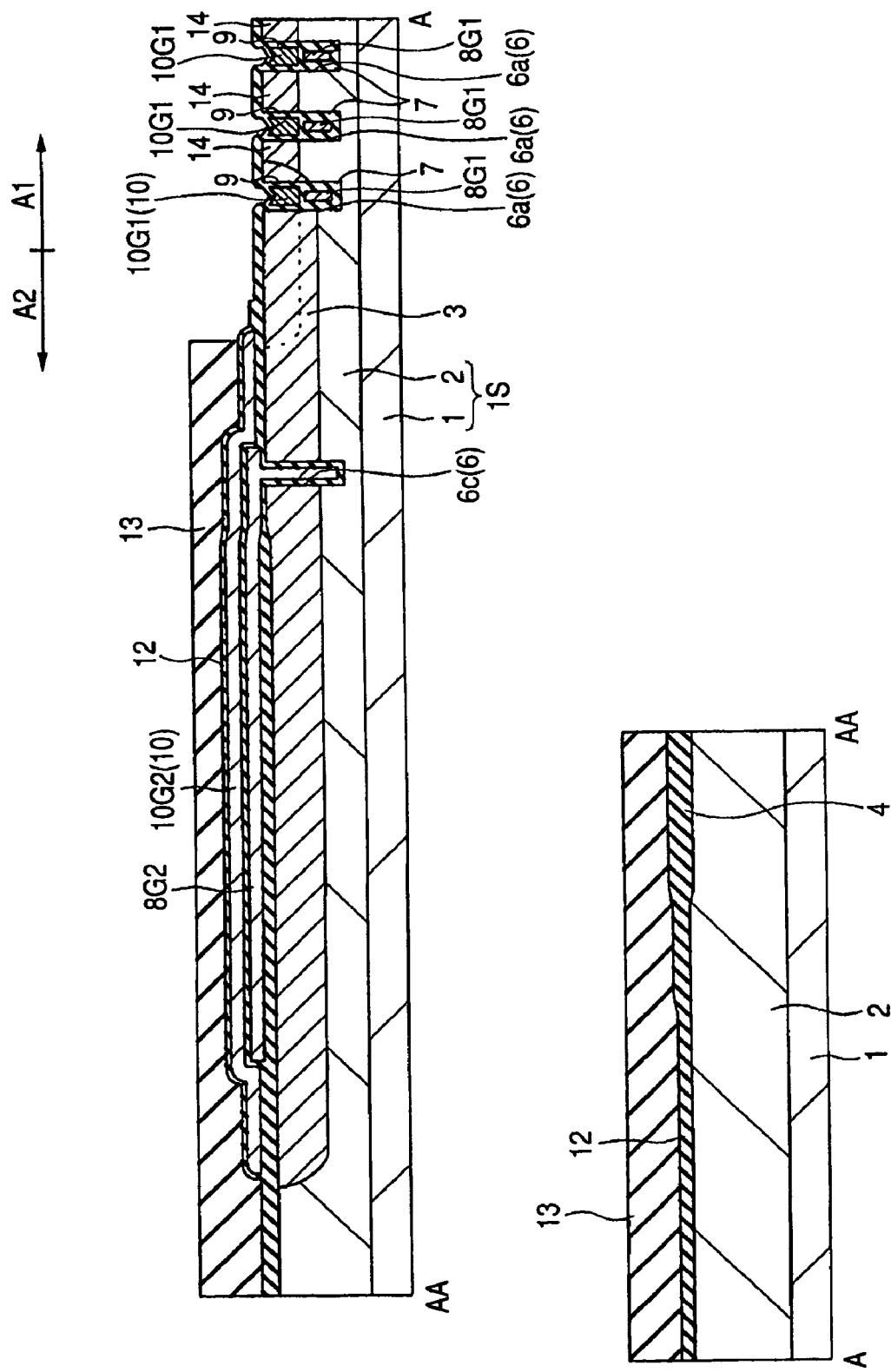
FIG. 21 is a principal part cross-sectional view of the semiconductor device in the manufacturing process following FIG. 20.

Then, by patterning conductive film 10 using etching technology, second gate electrode 10G1 is formed in trench 6, and ashing removes resist film 11 after that (refer to FIG. 21). Second gate electrode 10G1 is made into the recess structure of denting the upper surface rather than the main surface of substrate 1S. Second gate electrode lead-out part 10G2 is formed by patterning of conductive film 10. Second gate electrode lead-out part 10G2 is electrically connected with second gate electrode 10G1.

The impurity concentration of the n type impurity introduced into second gate electrode 10G1 is higher than the impurity concentration of the n type impurity introduced into first gate electrode 8G1. In other words, the resistivity of second gate electrode 10G1 is low compared with the resistivity of first gate electrode 8G1. This is because power MISFET by which parallel connection is done will become difficult to operate uniformly when the resistance of second gate electrode 10G1 is high. That is, when power MISFET does not operate uniformly, the inconvenience that the electrostatic discharge damage tolerance amount and avalanche tolerance amount of a gate insulating film will fall, and the inconvenience that switching speed will become slow will generate.

Here, avalanche tolerance amount is explained. Where inductive load is connected, when turn-off of power MISFET is done, the voltage of the sum of supply voltage and induced electromotive force will be momentarily applied between the source region and the drain region. When this voltage exceeds a breakdown voltage, it will be in an avalanche breakdown state. At this time, the thing of the product (avalanche energy) of the maximum value of avalanche current and time which can be passed without destroying is said.

In order to prevent such inconvenience that the electrostatic discharge damage tolerance amount and avalanche tolerance amount of a gate insulating film will fall and inconvenience that switching speed will become slow, it is necessary to lower the resistance of second gate electrode 10G1. From this, the polysilicon film which added impurities, such as phosphorus or arsenic, beforehand at the time of formation is used for formation of second gate electrode 10G1. According to the polysilicon film which added the impurity beforehand, resistance reduction of a polysilicon film can be aimed at compared with the polysilicon film which formed without adding an impurity at the time of formation, and introduced the impurity with ion implantation after that. For example, according to the polysilicon film of 500 nm of thickness which added the impurity beforehand, the resistance reduction of the sheet resistance can be carried out to about 10Ω/□. On the other hand, according to the polysilicon film of 500 nm of thickness which introduced the impurity with ion implantation, sheet resistance can be lowered only to about 20Ω/□. Therefore, it is desirable to use the polysilicon film which added the impurity beforehand for formation of second gate electrode 10G1.

On the other hand, since first gate electrode 8G1 is not second gate electrode 10G1 of power MISFET, even if resistivity is higher than second gate electrode 10G1, power MISFET by which parallel connection is done does not become difficult to operate uniformly. Since first gate electrode 8G1 is having structure covered by insulation film 7 thicker than insulation film 9, even if resistance is higher than second gate electrode 10G1, it tends to secure electrostatic discharge damage tolerance amount. Therefore, after first gate electrode 8G1 forms the intrinsic polysilicon film which does not add an impurity, it can be formed with the polysilicon film which introduced the impurity into this intrinsic polysilicon film using ion implantation. Here, it is also possible for first gate electrode 8G1 to be formed with the polysilicon film which added the impurity beforehand.

Then, as shown in FIG. 21, insulation film 12 which consists of a silicon oxide film is formed by heat-treating to the main surface of substrate 1S. Then, resist film 13 is applied to the main surface of substrate 1S, the photolithography technology of performing exposure and development is used, and resist film 13 is patterned. Insulation film 12 has a function as a screen film at the time of the ion implantation for channel region formation of MISFET. The pattern of resist film 13 has a function as a mask for channel region formation of MISFET.

Then, resist film 13 is used as a mask and p type (second conductivity type) impurities, such as boron, are introduced into the main surface of substrate 1S with ion implantation, for example. After removing resist film 13, p type semiconductor layer (second semiconductor layer) 14 is formed by performing thermal diffusion processing to substrate 1S. This p type semiconductor layer 14 is a main surface side of substrate 1S, is formed in n⁻ type epitaxial layer 2, and forms the channel region of power MISFET. With the pattern of resist film 13, as the dashed line of FIG. 21 shows, p type semiconductor layer 14 overlaps with p⁻ type well 3.

Figure 22:
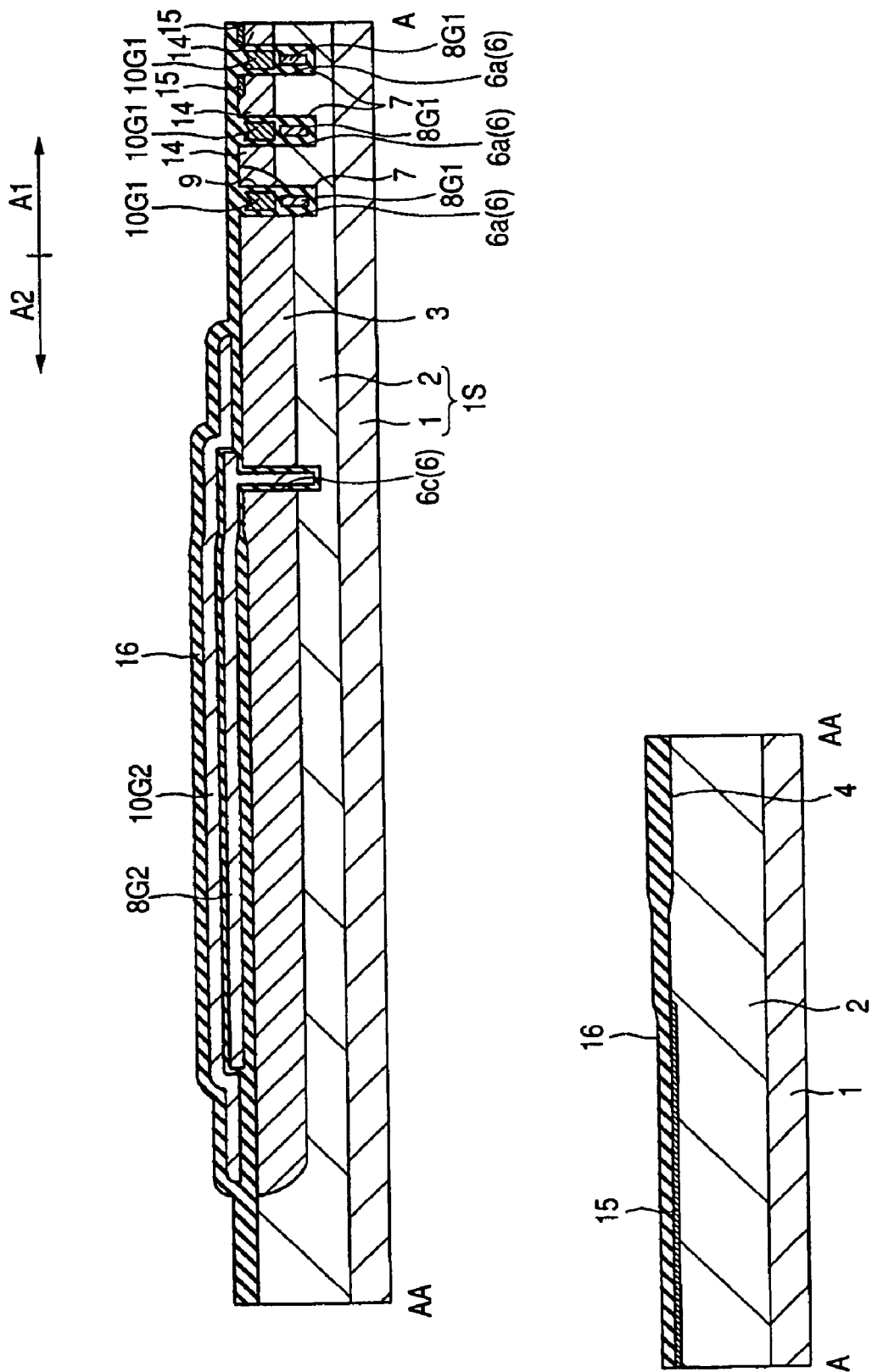
FIG. 22 is a principal part cross-sectional view of the semiconductor device in the manufacturing process following FIG. 21.

Then, as shown in FIG. 22, the impurity of n types (first conductivity type), such as phosphorus and arsenic, is introduced into the main surface of substrate 1S with ion implantation, for example by using the patterned resist film (not shown) for source region formation of power MISFET as a mask. After removing a resist film, n⁺ type semiconductor layer 15 is formed by performing thermal diffusion processing to substrate 1S. n⁺ type semiconductor layer 15 in cell area A1 constitutes the source region of power MISFET. Subsequently, interlayer insulation film 16 which consists of a silicon oxide film, for example is formed on the main surface of substrate 1S.

Figure 23:
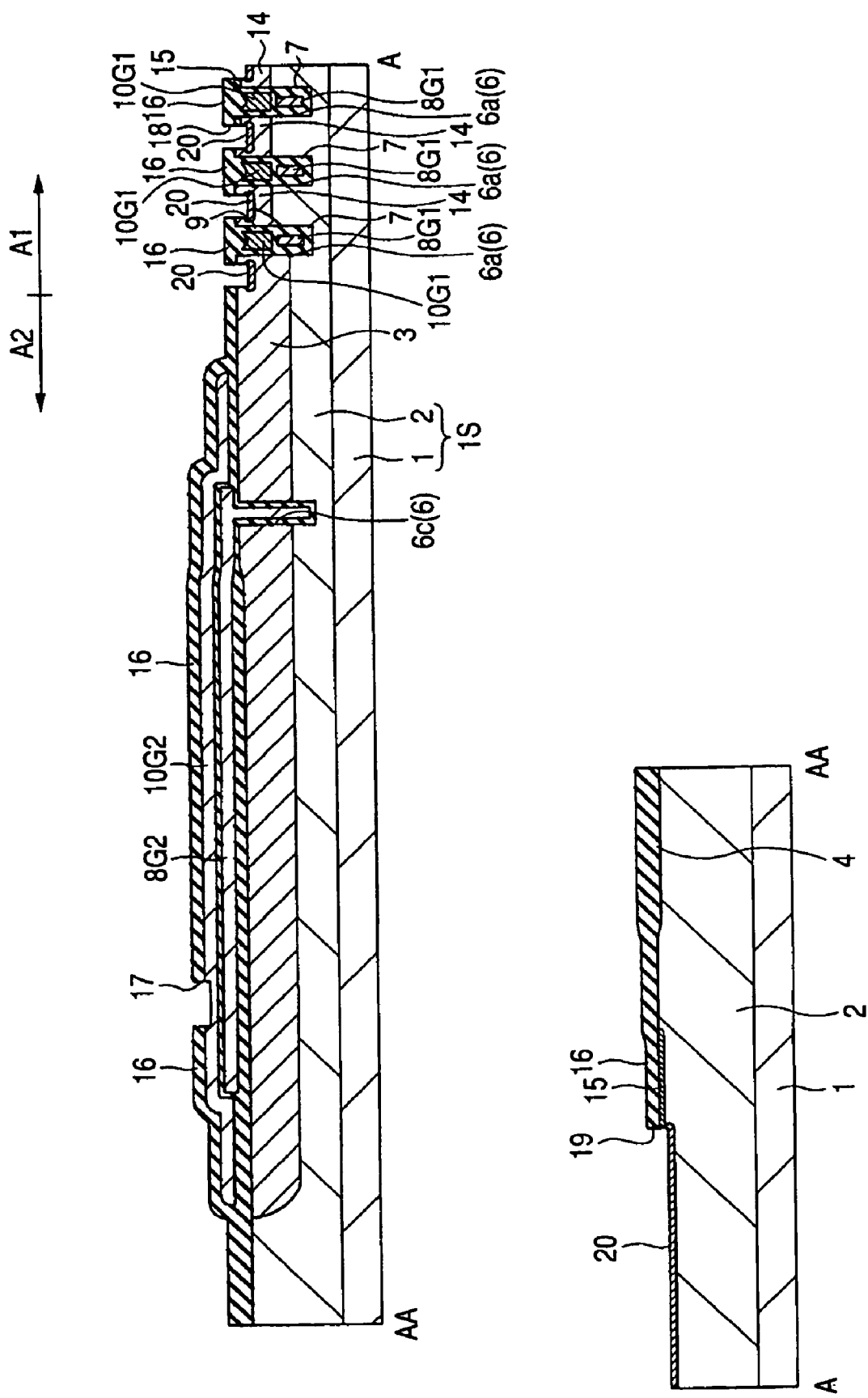
FIG. 23 is a principal part cross-sectional view of the semiconductor device in the manufacturing process following FIG. 22.

Then, as shown in FIG. 23, the patterned resist film whose contact hole formation region exposes on interlayer insulation film 16 is used as an etching mask. After etching interlayer insulation film 16, contact holes 17, 18, and 19 are formed in interlayer insulation film 16 by removing a resist film. Contact hole 17 reaches to second gate electrode lead-out part 10G2, and contact hole 18 has reached p type semiconductor layer 14 for channel formation formed in the main surface of substrate 1S. Contact hole 19 is formed in peripheral region A2, and has reached n⁺ type semiconductor layer 15 used as a channel stopper.

Then, in cell area A1, a trench is formed by etching the main surface of substrate 1S exposed to the bottom of contact holes 18 and 19. Then, p⁺ type semiconductor layer 20 is formed by introducing p type impurities, such as boron, into the bottom of the trench with ion implantation, for example.

Figure 24:
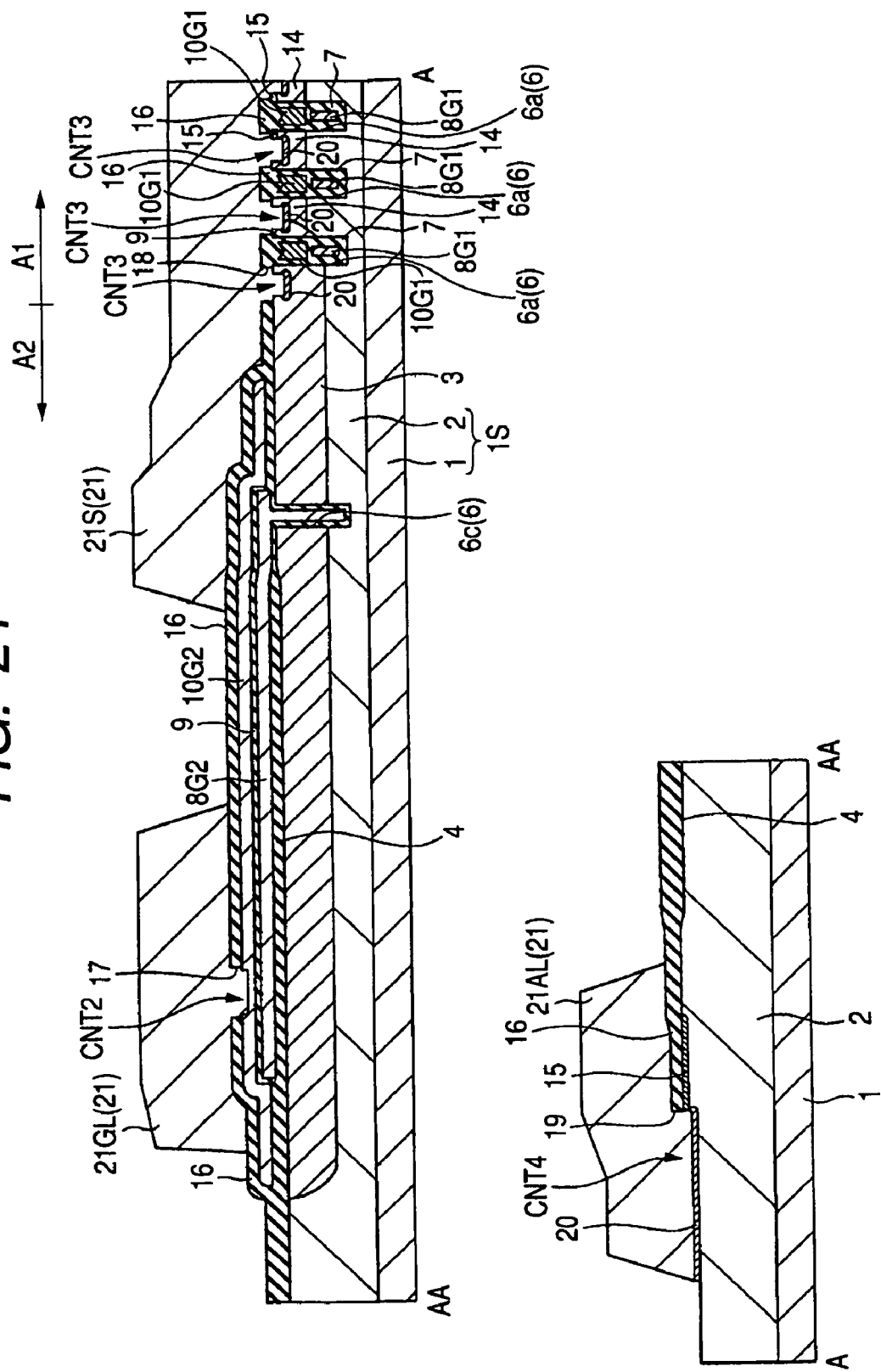
FIG. 24 is a principal part cross-sectional view of the semiconductor device in the manufacturing process following FIG. 23.

Then, as shown in FIG. 24, for example, the titanium tungsten (TiW) film (not shown) used as a barrier metal film is formed on the main surface of substrate 1S. Then, an aluminum film is further formed on this titanium tungsten film, for example using a sputtering method. And laminated film 21 which consists of a titanium tungsten film and an aluminum film is patterned by using photolithography technology and etching technology. By this patterning, source electrode 21S, gate electrode wiring 21GL, and outermost periphery electrode wiring 21AL which consist of laminated film 21 are formed. On this occasion, contact CNT2, CNT3, and CNT4 are formed by embedding contact holes 17, 18, and 19 by laminated film 21, respectively.

Source electrode 21S is formed so that contact hole 18 may be embedded, and source electrode 21S is formed so that source electrode 21S may connect with n⁺ type semiconductor layer 15 and p⁺ type semiconductor layer 20. Gate electrode wiring 21GL is connected to second gate electrode lead-out part 10G2 via contact hole 17. Since this second gate electrode lead-out part 10G2 is connected with second gate electrode 10G1, gate electrode wiring 21GL is electrically connected with second gate electrode 10G1. Outermost periphery electrode wiring 21AL is formed so that contact hole 19 may be embedded, and outermost periphery electrode wiring 21AL is formed so that outermost periphery electrode wiring 21AL may connect with n⁺ type semiconductor layer 15 and p⁺ type semiconductor layer 20.

Then, after forming surface protection film 25 which consists of a polyimide resin film on the main surface of substrate 1S, surface protection film 25 (refer to FIG. 8) is patterned using photolithography technology. Patterning is performed so that a part of source electrodes 21S and a part of gate electrode wiring 21GL may be exposed, and the patterning forms source pad SP and gate pad GP (refer to FIG. 4).

Then, after grinding the back surface of substrate 1S, a sputtering method is used, laminated film 26 which consists of a titanium film, a nickel film, and a gold film is formed all over the back surface of substrate 1S, and drain electrode 26D which consists of laminated film 26 is formed (refer to FIG. 8). Thus, the semiconductor device in Embodiment 1 can be formed.

Embodiment 2

Figure 25:
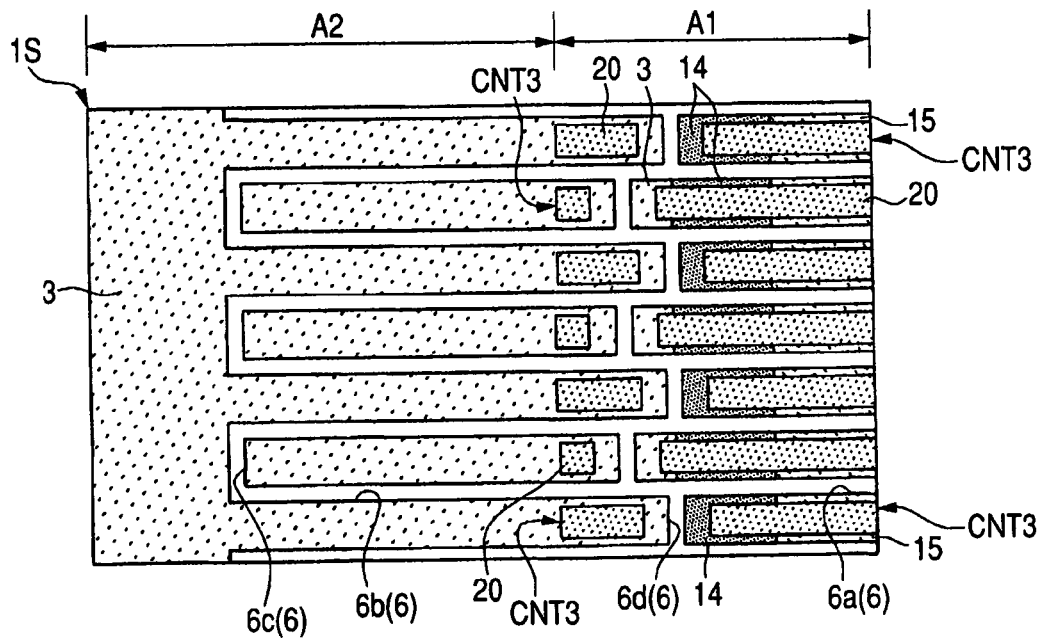
FIG. 25 is the plan view which expanded the circumference of the cell area of the semiconductor device in Embodiment 2 of the present invention.

As shown in FIG. 25, as for the semiconductor device in Embodiment 2 of the present invention, only the pattern of trench 6 formed in substrate 1S is different from the semiconductor device (refer to FIG. 7) of the Embodiment 1. In Embodiment 2, the pattern of trench 6 of cell area A1 is made a stripe pattern, and it is set as a pattern which forms shutdown trench 6d alternately near the peripheral region A2. Hereby, the balance of on resistance and gate capacitance can be optimized.

Embodiment 3

Figure 26:
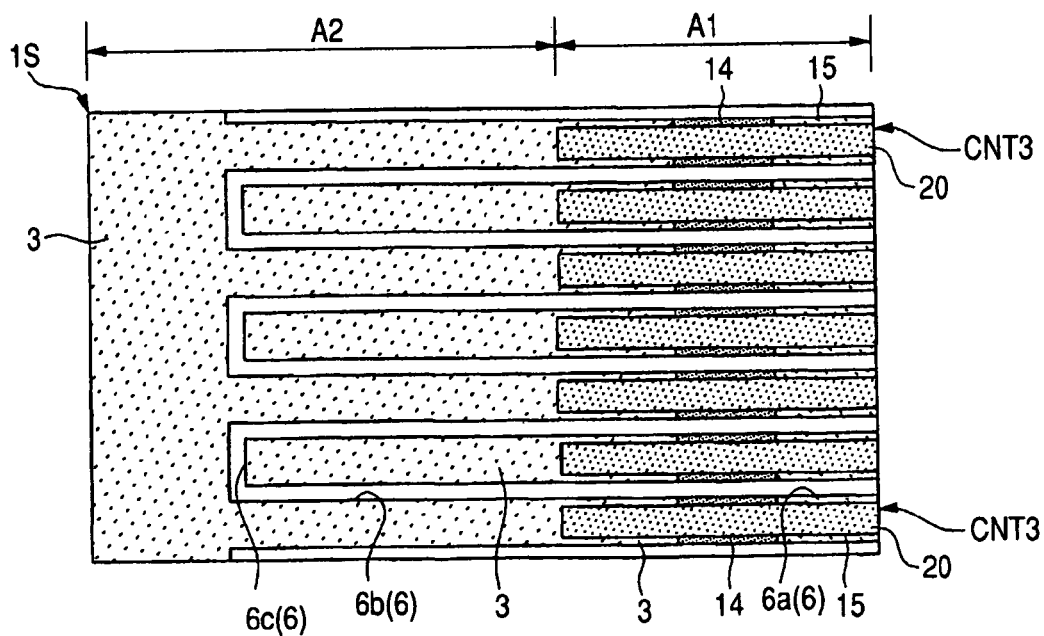
FIG. 26 is the plan view which expanded the circumference of the cell area of the semiconductor device in Embodiment 3 of the present invention.

As shown in FIG. 26, as for the semiconductor device in Embodiment 3 of the present invention, only the pattern of trench 6 formed in substrate 1S is different from the semiconductor device (refer to FIG. 7) of the Embodiment 1. In Embodiment 3, the pattern of trench 6 of cell area A1 is made the stripe pattern. Since the gate area is small as compared with a mesh pattern, gate capacitance can be reduced. Hereby, processing failure of trench 6 in cell area A1 can be reduced.

Embodiment 4

Figure 27:
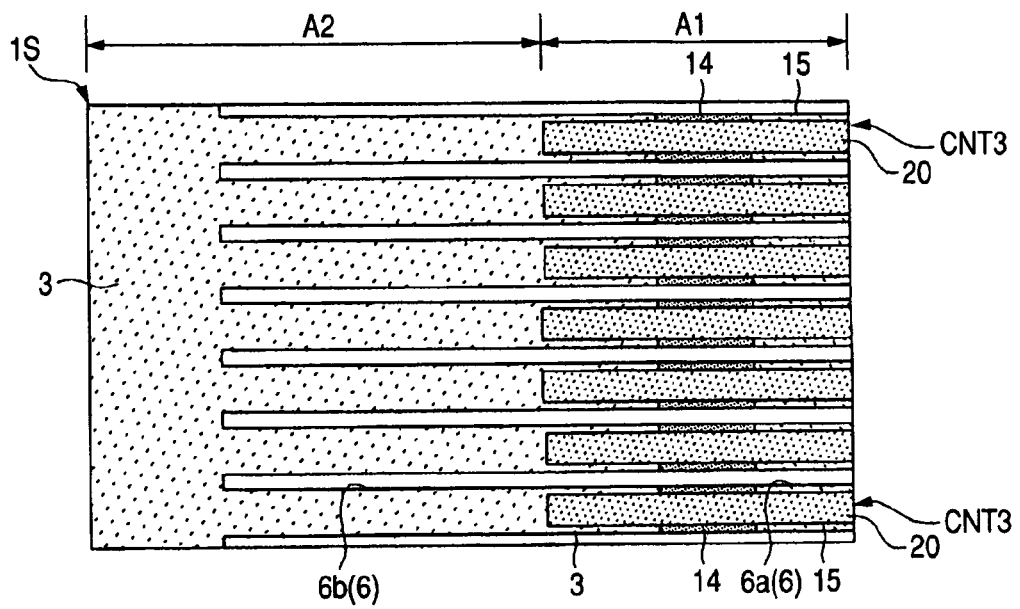
FIG. 27 is the plan view which expanded the circumference of the cell area of the semiconductor device in Embodiment 4 of the present invention.

As shown in FIG. 27, as for the semiconductor device in Embodiment 4 of the present invention, only the pattern of trench 6 formed in substrate 1S is different from the semiconductor device (refer to FIG. 7) of the Embodiment 1. In Embodiment 4, the pattern of trench 6 of cell area A1 is made a stripe pattern, and it is set as the pattern whose termination of trench 6 (leading trench 6b) of peripheral region A2 is separated (interconnection is not done), respectively. Although the form of the termination of trench 6 may become thin and may spoil gate reliability, it can be prevented that p⁻ type well 3 will be in a floating state.

Embodiment 5

Figure 28:
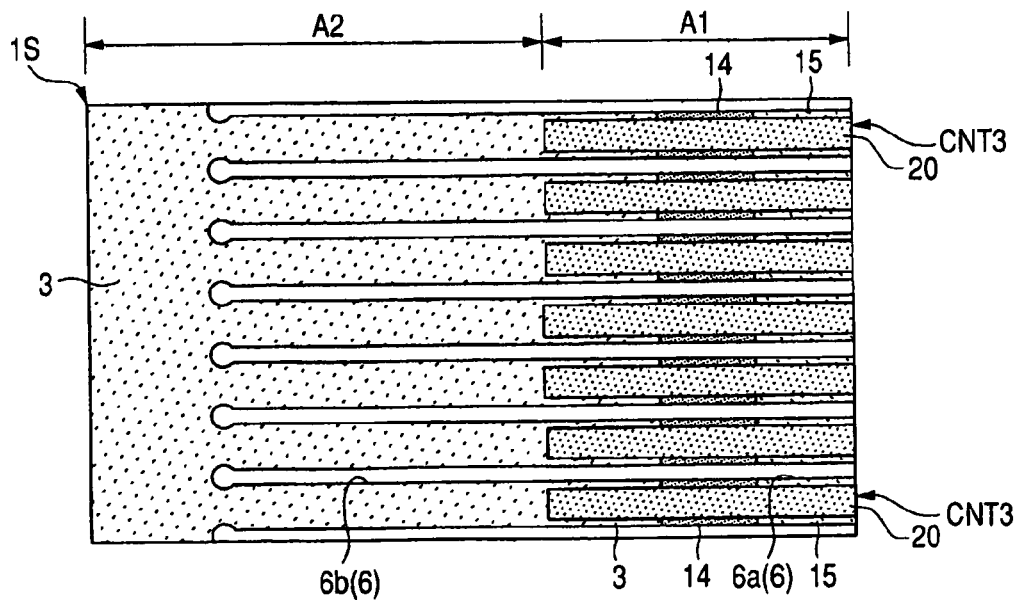
FIG. 28 is the plan view which expanded the circumference of the cell area of the semiconductor device in Embodiment 5 of the present invention.

As shown in FIG. 28, as for the semiconductor device in Embodiment 5 of the present invention, only the pattern of trench 6 formed in substrate 1S is different from the semiconductor device (refer to FIG. 7) of the Embodiment 1. In Embodiment 5, the pattern of trench 6 of cell area A1 is made a stripe pattern, and the termination of trench 6 (leading trench 6b) of peripheral region A2 has separated, respectively, and is setting it as the pattern which extended each termination round. Hereby, electric field relaxation in the termination of trench 6 can be aimed at. Lowering of the gate reliability by the defect of shape that a termination tapers off can be prevented.

Embodiment 6

Figure 29:
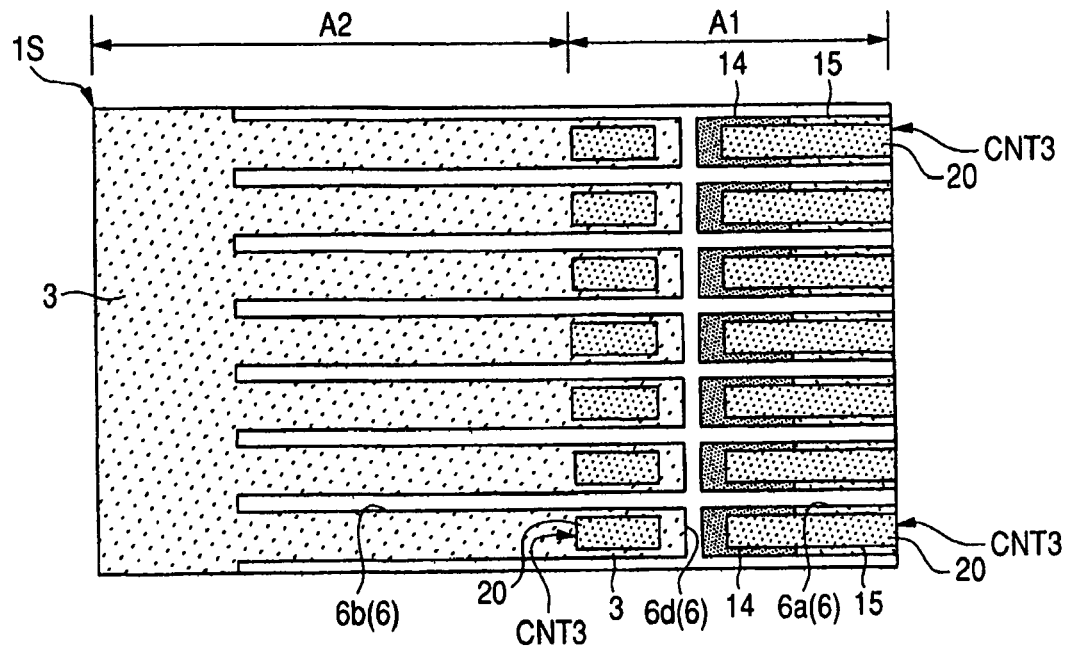
FIG. 29 is the plan view which expanded the circumference of the cell area of the semiconductor device in Embodiment 6 of the present invention.

As shown in FIG. 29, as for the semiconductor device in Embodiment 6 of the present invention, only the pattern of trench 6 formed in substrate 1S is different from the semiconductor device (refer to FIG. 7) of the Embodiment 1. In Embodiment 6, the pattern of trench 6 of cell area A1 is made a stripe pattern, and it is set as a pattern which forms shutdown trench 6d in the shape of a straight line near the peripheral region A2. It is set as the pattern whose termination of trench 6 (leading trench 6b) of peripheral region A2 is separated, respectively. Hereby, the balance of on resistance and gate capacitance can be optimized, and the processing failure of trench 6 can be reduced.

Embodiment 7

Figure 30:
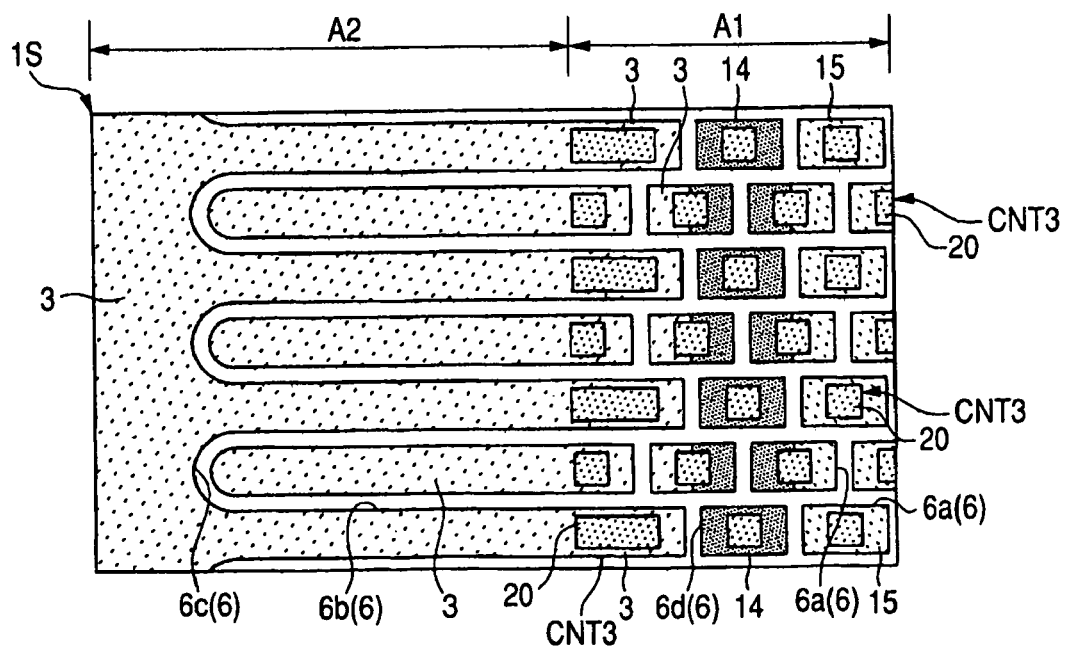
FIG. 30 is the plan view which expanded the circumference of the cell area of the semiconductor device in Embodiment 7 of the present invention.

As shown in FIG. 30, as for the semiconductor device in Embodiment 7 of the present invention, only the pattern of trench 6 formed in substrate 1S is different from the semiconductor device (refer to FIG. 7) of the Embodiment 1. In Embodiment 7, it is set as the pattern that connection trench 6c which connects the termination of trench 6 (leading trench 6b) of peripheral region A2 in a pair (every two pieces) becomes circular. Hereby, gate reliability can be further improved to the semiconductor device in the Embodiment 1.

Embodiment 8

Figure 31:
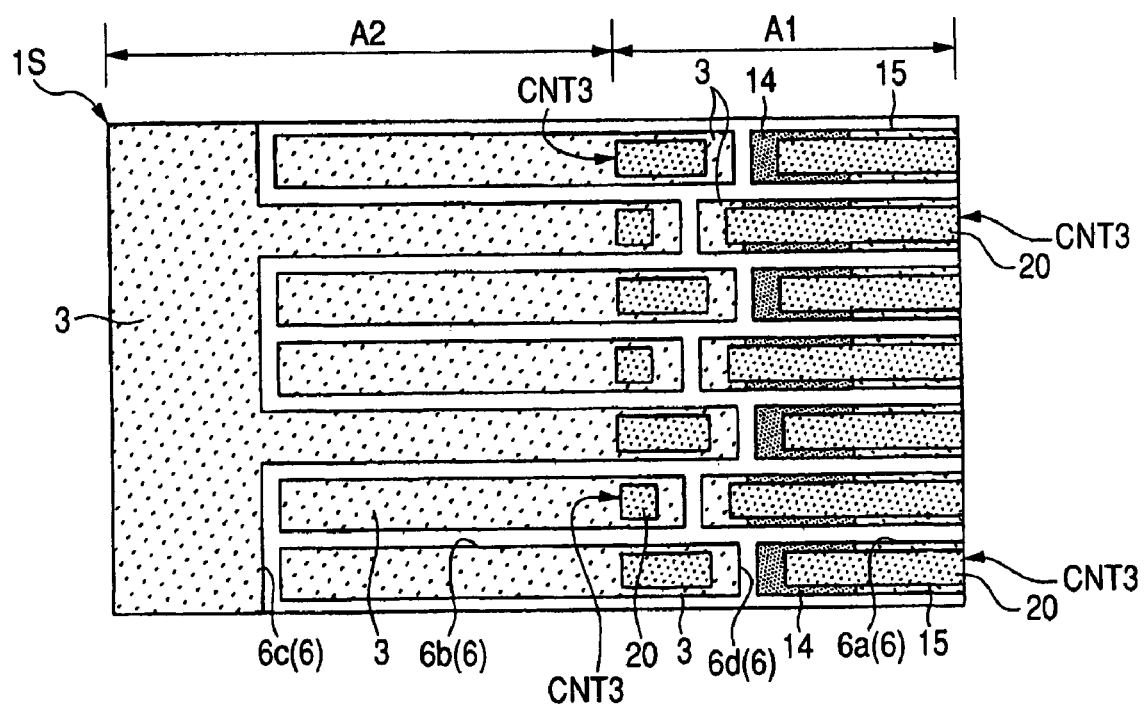
FIG. 31 is the plan view which expanded the circumference of the cell area of the semiconductor device in Embodiment 8 of the present invention.

As shown in FIG. 31, as for the semiconductor device in Embodiment 8 of the present invention, only the pattern of trench 6 formed in substrate 1S is different from the semiconductor device (refer to FIG. 7) of the Embodiment 1. In Embodiment 8, the pattern of trench 6 of cell area A1 is made a stripe pattern, and it is set as a pattern which forms shutdown trench 6d alternately near the peripheral region A2. It is set as the pattern that connection trench 6c which connects the termination of trench 6 (leading trench 6b) of peripheral region A2 respectively by three pieces becomes straight line-like. Hereby, the balance of on resistance and gate capacitance can be optimized. Like the pattern of trench 6 shown by FIG. 1, if connection trench 6c does not connect all the terminations of trench 6 of peripheral region A2 in the shape of a straight line and p⁻ type well 100B of floating is not formed, the termination of trench 6 (leading trench 6b) of peripheral region A2 may be connected by four or more pieces.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, the embodiment explained the case which used the first conductivity type as n type, and the present invention was applied to n channel type power MISFET by using a second conductivity type as a p type. However, a first conductivity type can be used as a p type, and the present invention can be applied also to p channel type power MISFET by using a second conductivity type as n type. Here, in n channel type power MISFET, in order to prevent a third semiconductor layer being in a floating state, the example which fixes the electric potential of the third semiconductor layer to the same ground potential as the second semiconductor layer was explained. However, the electric potential which should be fixed changes according to a situation. For example, when applying p channel type power MISFET to a high side switch, a third semiconductor layer will be fixed to supply voltage (Vcc) electric potential. That is, what is necessary is just the structure electrically connected so that the third semiconductor layer may become the same electric potential as the second semiconductor layer.

Although the embodiment explained the case where MISFET was applied, as a power semiconductor element for example, it is applicable also to IGBT. In MISFET of the embodiment, it is because IGBT will be the same structure as fundamentally as vertical type power MISFET when removing that a substrate is not n+ type but a p+n+ type.

Although the embodiment, for example, explained the case where a silicon substrate was used as a semiconductor substrate, not only this but a silicon carbide (SiC) substrate, a gallium nitride (GaN) substrate, etc. may be used.

The present invention is used for the manufacture of a semiconductor device, especially of the semiconductor device provided with the gate control type power semiconductor element broadly.

What is claimed is:

1. A semiconductor device provided with a gate control type semiconductor element formed in a substrate with a first surface, and a second surface over the reverse side, comprising:
    a first semiconductor layer of a first conductivity type which is formed in the first surface side of the substrate, and forms a drift region of the semiconductor element;
    a second semiconductor layer of a second conductivity type opposite to the first conductivity type which is the first surface side of the substrate, is formed in the first semiconductor layer, and forms a channel region of the semiconductor element;
    a third semiconductor layer of the second conductivity type which is the first surface side of the substrate, and is formed in the first semiconductor layer in contact with the second semiconductor layer and whose depth from the first surface of the substrate is deeper than the second semiconductor layer;
    a trench which is patterned in the first surface of the substrate and whose depth from the first surface of the substrate is deeper than the third semiconductor layer; and
    a first conductive film formed in an inside of the trench via a first insulation film;
    wherein
    the substrate has a cell area in which the semiconductor element is formed, and a peripheral region contiguous to the cell area; and
    between a plurality of cell trenches in which a gate electrode of the semiconductor element is formed among the trenches in the cell area, one end of the third semiconductor layer is formed, and the other end of the third semiconductor layer is formed in the peripheral region.

2. A semiconductor device according to claim 1, wherein a second conductive film is formed in an inside upper part of the cell trenches via a second insulation film thinner than the first insulation film;
    the first conductive film is formed in an internal bottom side of the cell trenches via the first insulation film; and inside the cell trenches, the first conductive film and the second conductive film are electrically separated by the second insulation film formed over the first conductive film.

3. A semiconductor device according to claim 1, wherein the trench patterned in the cell area is a ladder-like mesh pattern with which a knot constitutes T shape.

4. A semiconductor device according to claim 1, wherein a plane form of the substrate is rectangular shape; the trench is not formed in four corners of the substrate; and in each of the four corners, the third semiconductor layer and the second semiconductor layer are electrically connected via contact.

5. A semiconductor device according to claim 1, wherein a plurality of leading trenches prolonged in a direction of the peripheral region from the cell area are formed among the trenches in the peripheral region; and a connection trench which connects a part of termination of the leading trenches is formed among the trenches in the peripheral region.

6. A semiconductor device according to claim 1, wherein in the cell area, an active cell which functions as the semiconductor element, and an inactive cell which does not function as the semiconductor elements are formed;
    a cell trench of the active cell and a cell trench of the inactive cell are included in the cell trenches; and
    the cell trenches of the inactive cells are formed in the third semiconductor layer.

7. A semiconductor device according to claim 2, wherein the trench patterned in the cell area is a ladder-like mesh pattern with which a knot constitutes T shape.

8. A semiconductor device according to claim 7, wherein a plane form of the substrate is rectangular shape;
    the trench is not formed in four corners of the substrate; and a contact which electrically connects the third semiconductor layer with the second semiconductor layer is formed in each of the four corners.

9. A semiconductor device according to claim 8, wherein a plurality of leading trenches prolonged in a direction of the peripheral region from the cell area are formed among the trenches in the peripheral region; and
    a connection trench which connects a termination of the leading trenches is formed among the trenches in the peripheral region.

10. A semiconductor device according to claim 9, wherein in the cell area, an active cell which functions as the semiconductor element, and an inactive cell which does not function as the semiconductor elements are formed;
    a cell trench of the active cell and a cell trench of the inactive cell are included in the cell trenches; and
    the cell trenches of the inactive cells are formed in the third semiconductor layer.

* * * * *